(12) United States Patent
Kang et al.

(10) Patent No.: US 9,053,813 B2
(45) Date of Patent: Jun. 9, 2015

(54) METHOD AND APPARATUS FOR REFRESHING AND DATA SCRUBBING MEMORY DEVICE

(75) Inventors: Uk-Song Kang, Seongnam-si (KR); Hak-Soo Yu, Seongnam-si (KR); Chul-Woo Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 925 days.

(21) Appl. No.: 13/241,205

(22) Filed: Sep. 23, 2011

(65) Prior Publication Data

US 2012/0317352 A1 Dec. 13, 2012

(30) Foreign Application Priority Data

Jun. 9, 2011 (KR) .................. 10-2011-0055744

(51) Int. Cl.
*G06F 13/00* (2006.01)
*G06F 13/28* (2006.01)
*G11C 11/406* (2006.01)
*G06F 11/10* (2006.01)
*G11C 29/52* (2006.01)
*G11C 11/40* (2006.01)
*G11C 29/04* (2006.01)

(52) U.S. Cl.
CPC ........ *G11C 11/40618* (2013.01); *G06F 11/106* (2013.01); *G11C 11/40* (2013.01); *G11C 11/40611* (2013.01); *G11C 11/40622* (2013.01); *G11C 29/52* (2013.01); *G11C 2029/0409* (2013.01); *G11C 2029/0411* (2013.01)

(58) Field of Classification Search
CPC ............ G06F 11/106; G11C 11/40618; G11C 11/40622; G11C 11/40611
See application file for complete search history.

(56) References Cited

U.S. PATENT DOCUMENTS

| 5,127,014 A | 6/1992 | Raynham ..................... 371/37.3 |
| 7,318,183 B2 | 1/2008 | Ito et al. ......................... 714/754 |
| 2003/0191888 A1* | 10/2003 | Klein ............................. 711/105 |
| 2010/0106901 A1 | 4/2010 | Higeta et al. |
| 2012/0246544 A1* | 9/2012 | Resnick et al. ............... 714/764 |
| 2012/0254698 A1* | 10/2012 | Ozer et al. .................... 714/764 |

OTHER PUBLICATIONS

Japanese Patent Publication No. 1995-249540 to Richiyaado et al., having Publication date of Sep. 27, 1995 (w/ English Abstract page).

* cited by examiner

*Primary Examiner* — Edward Dudek, Jr.
(74) *Attorney, Agent, or Firm* — Monica H. Choi

(57) ABSTRACT

At least one refresh without scrubbing is performed on a corresponding portion of the memory device with a first frequency. In addition, at least one refresh with scrubbing is performed on a corresponding portion of the memory device with a second frequency less than the first frequency. Accordingly, refresh operations with data scrubbing are performed to prevent data error accumulation. Furthermore, refresh operations without data scrubbing are also performed to reduce undue power consumption from the data scrubbing.

52 Claims, 24 Drawing Sheets

<Normal Case>

<tREF 2X Case>

METHOD AND APPARATUS FOR REFRESHING AND DATA SCRUBBING MEMORY DEVICE

CROSS-REFERENCE TO RELATED PATENT APPLICATION

This application claims priority under 35 USC §119 to Korean Patent Application No. 10-2011-0055744, filed on Jun. 9, 2011, in the Korean Intellectual Property Office (KIPO), the contents of which are incorporated herein in its entirety by reference.

BACKGROUND

The present invention relates to refreshing and data scrubbing of a memory device, and more particularly, to controlling refresh with data scrubbing and refresh without data scrubbing for enhanced data integrity without undue increase of power consumption.

Semiconductor memory devices have been developed to have increasing capacity and speed for use in high-performance electronic systems. For example, a dynamic random access memory (DRAM) is volatile memory that stores data according to an amount of charge stored in a capacitor. Because of leakage of such stored charge with time, a refresh operation for recharging data is performed to prevent loss of data.

Semiconductor memory devices are widely used in mobile devices such as laptop computers, mobile phones, etc. Thus, power consumption of the semiconductor memory devices is desired to be reduced. However, refresh operation of a dynamic memory device such as a DRAM increases standby power consumption. Moreover, the capacitance for storing charge in a DRAM decreases with increased integration of the DRAM resulting in degradation of data reliability.

SUMMARY

Accordingly, refresh operations with data scrubbing are performed to prevent data error accumulation. Furthermore, refresh operations without data scrubbing are also performed to reduce undue power consumption.

In a method of refreshing a memory device according to an aspect of the present invention, at least one refresh without scrubbing is performed on a corresponding portion of the memory device. In addition, at least one refresh with scrubbing is performed on a corresponding portion of the memory device.

According to an example embodiment of the present invention, a portion of the memory device has the refresh without scrubbing performed thereon with a first frequency and has the refresh with scrubbing performed thereon with a second frequency that is less than the first frequency.

In a further example embodiment of the present invention, the refresh without scrubbing alternates in time with the refresh with scrubbing.

In another example embodiment of the present invention, a first number of the at least one refresh without scrubbing is higher than a second number of the at least one refresh with scrubbing.

In a further example embodiment of the present invention, each refresh with scrubbing is performed between multiple refreshes without scrubbing.

In another example embodiment of the present invention, each refresh without scrubbing is performed in response to a first type refresh command generated from a memory controller. In addition, each refresh with scrubbing is performed in response to a second type refresh command generated from the memory controller.

For example, each refresh without scrubbing is performed in response to an auto or self refresh command generated from the memory controller. Also in that example case, each refresh with scrubbing is performed in response to a specialized refresh and scrub command generated from the memory controller In a further example embodiment of the present invention, a respective refresh with scrubbing is sequentially performed on each of at least two sub-pages of the memory device when the specialized refresh and scrub command is generated. Also in that case, such sub-pages of the memory device are precharged after the refresh with scrubbing of the sub-pages.

In another example embodiment of the present invention, each refresh without scrubbing is performed in response to a first type refresh command generated from a memory controller, and each refresh with scrubbing is performed in response to a refresh and scrub command generated from a refresh command counter. In that case for example, a period of the refresh and scrub command being generated is $2^n$ times of a period of the first type refresh command being generated with n being a natural number.

In a further example embodiment of the present invention, each refresh without scrubbing is performed in response to a self refresh command, and each refresh with scrubbing is performed from a count of internal refresh commands generated in response to the self refresh command.

In another example embodiment of the present invention, a first total number of the at least one refresh without scrubbing performed on the memory device is greater than a second total number of the at least one refresh with scrubbing performed on the memory device.

In a further example embodiment of the present invention, each refresh with or without scrubbing is performed on a respective page of memory cells.

In another example embodiment of the present invention, each refresh without scrubbing is performed on a respective page of memory cells, and each refresh with scrubbing is performed on a respective sub-page of memory cells.

According to another aspect of the present invention, a refresh management unit in a memory device includes a first counter and a second counter. The first counter is for controlling performance of at least one refresh without scrubbing on a corresponding portion of the memory device. The second counter is for controlling performance of at least one refresh with scrubbing on a corresponding portion of the memory device.

In an example embodiment of the present invention, the refresh management unit includes a page counter and a refresh command counter. The page counter is the first counter for generating a refresh address for having the refresh without scrubbing performed thereon. The refresh command counter is the second counter for controlling timing of the refresh with scrubbing and the refresh without scrubbing.

In a further example embodiment of the present invention, the refresh management unit includes a page segment counter for generating an address of a sub-page for having the refresh with scrubbing performed thereon. For example, each refresh without scrubbing is performed on a respective page of memory cells, and each refresh with scrubbing is performed on a respective sub-page of memory cells.

In another example embodiment of the present invention, the page counter generates the refresh address having the refresh without scrubbing performed thereon with a first frequency. In addition, the page segment counter generates the sub-page address having the refresh with scrubbing performed thereon with a second frequency that is less than the first frequency.

In a further example embodiment of the present invention, each refresh without scrubbing is performed in response to a self refresh command. In addition, each refresh with scrubbing is performed from the refresh command counter counting internal refresh commands generated in response to the self refresh command.

In another example embodiment of the present invention, the refresh without scrubbing alternates in time with the refresh with scrubbing.

In a further example embodiment of the present invention, a first number of the at least one refresh without scrubbing is higher than a second number of the at least one refresh with scrubbing. For example, each refresh with scrubbing is performed between multiple refreshes without scrubbing.

In another example embodiment of the present invention, each refresh without scrubbing is performed in response to a first type refresh command generated from a memory controller. In addition, each refresh with scrubbing is performed in response to a second type refresh command generated from the memory controller.

For example, each refresh without scrubbing is performed in response to an auto or self refresh command generated from the memory controller. Also in that case, each refresh with scrubbing is performed in response to a specialized refresh and scrub command generated from the memory controller.

In a further example embodiment of the present invention, a respective refresh with scrubbing is sequentially performed to each of at least two sub-pages of the memory device when the specialized refresh and scrub command is generated. In that case, such sub-pages of the memory device are precharged after the refresh with scrubbing of the sub-pages.

In another example embodiment of the present invention, each refresh without scrubbing is performed in response to a first type refresh command generated from a memory controller. Each refresh with scrubbing is performed in response to a refresh and scrub command generated from a refresh command counter.

In a further example embodiment of the present invention, a period of the refresh and scrub command being generated is $2^n$ times of a period of the first type refresh command being generated with n being a natural number.

In another example embodiment of the present invention, a first total number of the at least one refresh without scrubbing performed on the memory device is greater than a second total number of the at least one refresh with scrubbing performed on the memory device.

In a further example embodiment of the present invention, each refresh with or without scrubbing is performed on a respective page of memory cells.

A memory device according to aspects of the present invention includes a cell array and the refresh management unit of the above-described example embodiments of the present invention. Such a memory device may be used in a memory module, a memory system, or a computer system.

BRIEF DESCRIPTION OF THE DRAWINGS

The above and other example aspects of the present invention will become more apparent when described in detailed exemplary embodiments thereof with reference to the attached drawings in which.

DETAILED DESCRIPTION OF THE EMBODIMENTS

Figure 1:
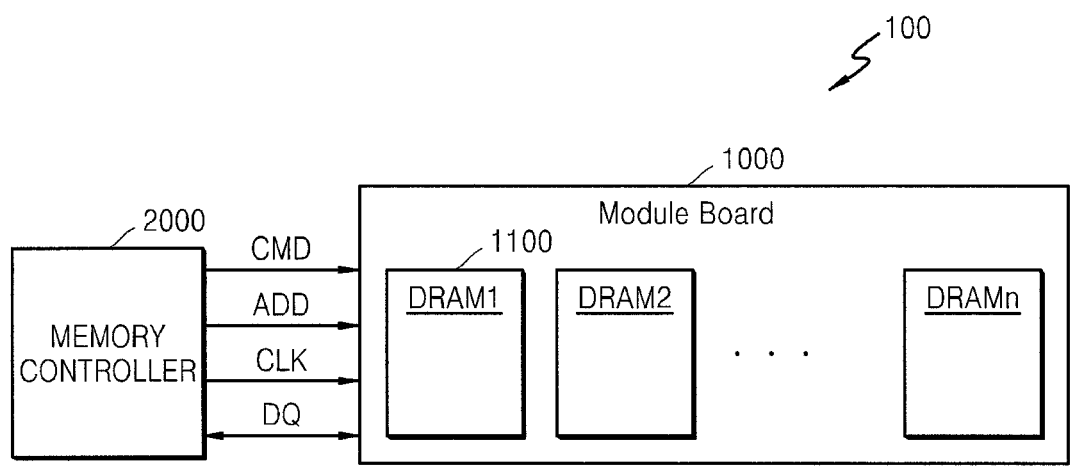
FIG. 1 is a block diagram of a semiconductor memory device, a memory module, and a memory system having a refresh operation according to an embodiment of the present invention.

Exemplary embodiments are described more fully hereinafter with reference to the accompanying drawings. However, the present inventive concepts may be embodied in many different forms and should not be construed as limited to the exemplary embodiments set forth herein. Rather, these exemplary embodiments are provided so that this disclosure is thorough and complete for fully conveying the scope of the present inventive concept to those skilled in the art. In the drawings, the sizes and relative sizes of layers and regions may be exaggerated for clarity.

Although the terms first, second, third etc. may be used herein to refer to various elements, these elements should not be limited by these terms. These terms are used to distinguish one element from another. Thus, a first element could be termed a second element without departing from the teachings of the present inventive concept. As used herein, the term "and/or" includes any and all combinations of one or more of the associated listed items.

When an element is referred to as being "connected" or "coupled" to another element, the element can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A volatile semiconductor memory device such as a dynamic random access memory (DRAM) retains data for a finite time period as indicated in a specification of the DRAM. Accordingly, a refresh operation is performed in every refresh period such as 64 ms for example as set in the specification of the DRAM.

As the DRAM cell becomes smaller with lower capacitance, the data retention time and the refresh period of the DRAM cell decrease. In this case, refresh operations are performed more frequently with increased power consumption. Moreover, a higher number of bit errors are generated as the DRAM cell becomes smaller such that the errors may not be corrected by an error correction circuit (ECC) or the probability of a physical error (for example a hard fail) increases.

A semiconductor memory device of embodiments of the present invention described below has improved data reliability with reduced power consumption and accumulation of errors. Such a memory device may be formed in a memory module or a memory system.

FIG. 1 is a block diagram of a memory system 100 with a semiconductor memory device and a memory module according to an embodiment of the present invention. Referring to FIG. 1, the memory system 100 includes a memory module 1000 and a memory controller 2000. The memory module 1000 includes at least one semiconductor memory device 1100 mounted on a module board. For example, each semiconductor memory device 1100 is a DRAM (dynamic random access memory) chip. The DRAM chip includes a memory array of DRAM cells. In descriptions below, it is assumed that the semiconductor memory device 1100 is a DRAM chip.

The memory controller 2000 provides signals for controlling the semiconductor memory devices 1100 in the memory module 1000. For example, such signals from the memory controller 2000 include a command/address CMD/ADD and a control signal CLK which may be a clock signal to the memory module 1000. The memory controller 2000 communicates with the memory module 1000 for transfer of data DQ to/from the memory module 1000.

Each DRAM chip 1100 includes a memory array forming a plurality of banks with each bank having a plurality of pages. A page is a block of data which is transferred from a bank to a bitline sense amplifier when a single RAS active command is applied. A page may be divided into a plurality of regions (hereinafter referred to as sub-pages).

Figure 2A:
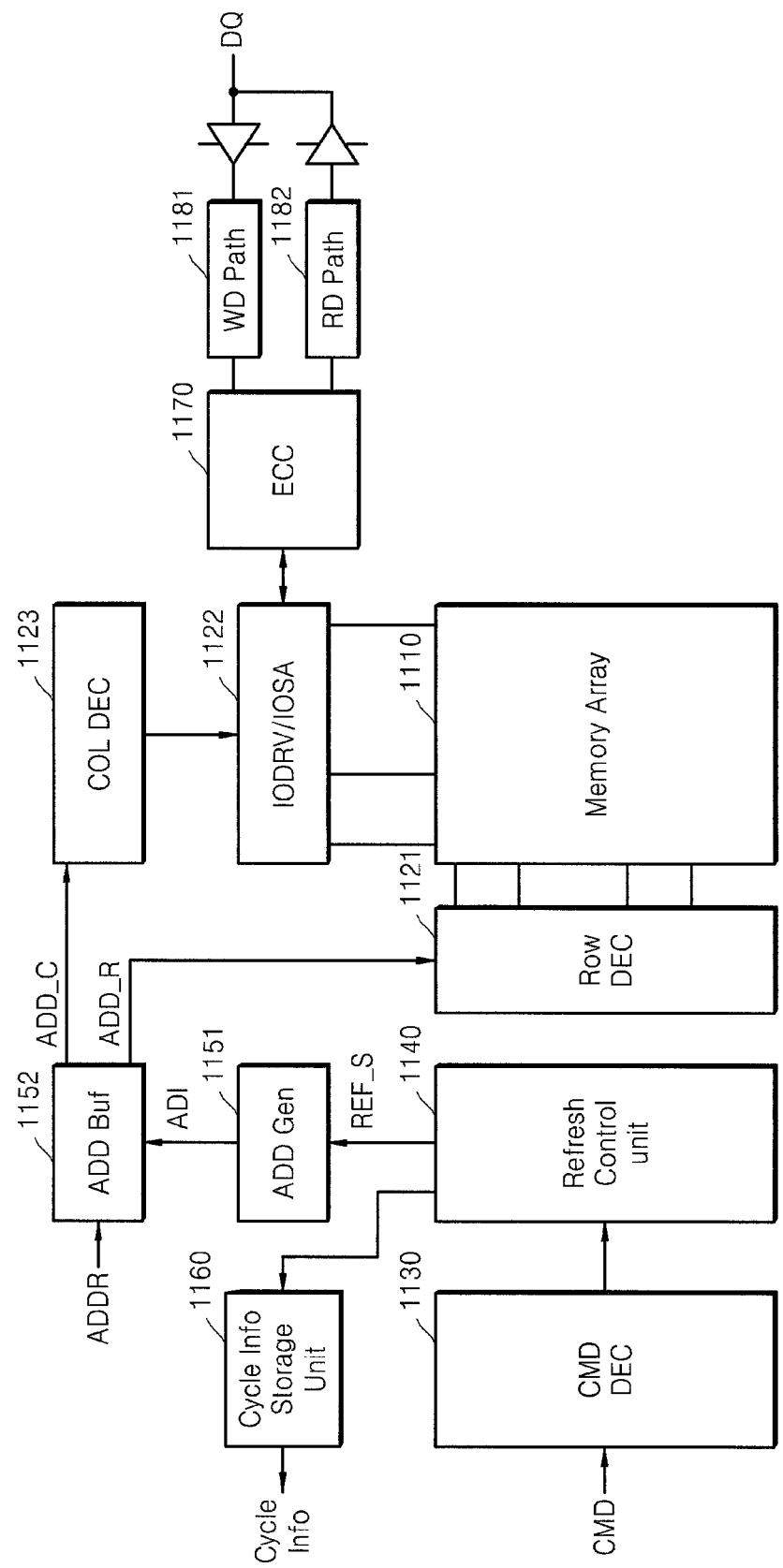
FIG. 2A is a block diagram of a dynamic random access memory (DRAM) chip in FIG. 1.
Figure 2B:
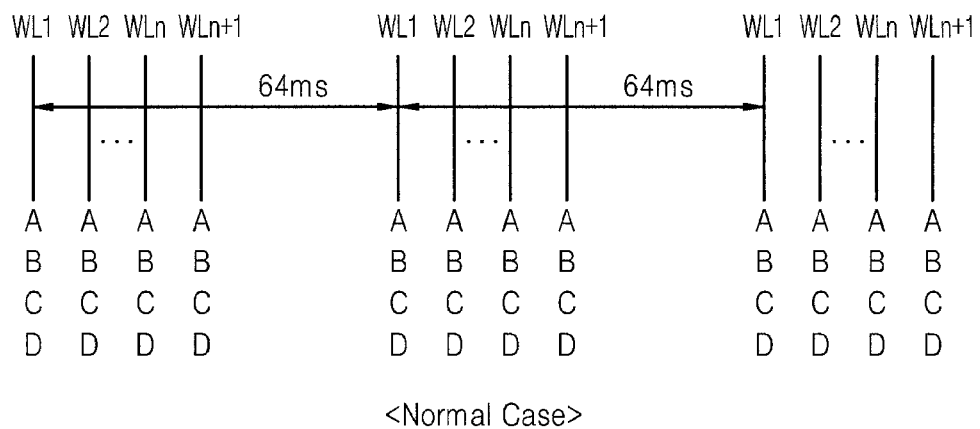
FIG. 2B illustrates an example of an increase of an auto refresh cycle, according to example embodiments of the present invention.
Figure 2B:
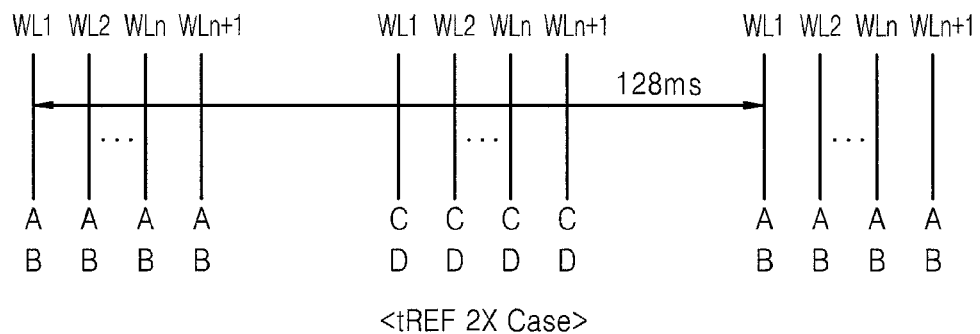

FIG. 2A is a block diagram of the DRAM chip 1100 of FIG. 1 according to an example embodiment of the present invention. FIG. 2B illustrates increasing an auto refresh cycle of the DRAM chip of FIG. 2A, according to an example embodiment of the present invention.

Referring to FIG. 2A, the DRAM chip 1100 includes a memory array 1110 with a plurality of DRAM cells, a row decoder 1121, a drive/sense amplifier 1122, and a column decoder 1123. For the input and output of data, the DRAM chip 1100 includes an ECC (error correction circuit) 1170 and read data (RD) and write data (WD) paths 1181 and 1182, respectively. The DRAM chip 1100 also includes a command decoder 1130, a refresh control circuit 1140, an internal address generator 1151, and an address buffer 1152. In addition, the DRAM chip 1100 includes a cycle information storage unit 1160 that is nonvolatile for storing refresh cycle information such as auto refresh cycle information (Cycle Info).

The command decoder 1130 decodes the command CMD received from an external source to generate at least one internal control signal for driving the DRAM chip 1100. The address buffer 1152 stores the address ADDR received from an external source and provides a row address ADD_R for selecting a row and a column address ADD_C for selecting a column to the row decoder 1121 and the column decoder 1123, respectively.

According to decoding by the command decoder 1130, the DRAM chip 1100 may enter an auto refresh mode or a self refresh mode. The refresh control circuit 1140 generates a refresh signal REF_S in response to such decoding by the command decoder 1130. The internal address generator 1151 generates an internal address ADI in response to the refresh signal REF_S for selecting a page on which refresh is to be performed and provides the internal address ADI to the address buffer 1152. The address buffer 1152 may include a switch (not shown) for selectively outputting the external address ADDR during a read/write operation and the internal address ADI in an auto or self refresh mode.

During an auto refresh operation, a period of the auto refresh cycle is adjusted to reduce power consumption of the DRAM chip 1100. A test is performed during a test mode of the DRAM chip 1100 by decreasing the period of the auto refresh cycle until a number of bit errors in the DRAM chip 1100 is capable of being corrected.

For example when the ECC 1170 uses a Hamming code capable of correcting a single-bit error, the period of the auto refresh cycle is decreased to a level where a single-bit error is generated. Auto refresh cycle information corresponding to that period of the auto refresh cycle is stored in the cycle information storage unit 1160. During data read-out, data read from the memory array 1110 is provided to the ECC 1170, and an error bit of the data is corrected by the ECC 1170.

The auto refresh cycle information stored in the cycle information storage unit 1160 is provided to an external controller (not shown) while the DRAM chip 1100 is operating. The external controller provides an auto refresh command to the DRAM chip 1100 with a period indicated by the auto refresh cycle information. The refresh control unit 1140 performs auto refresh in response to such an auto refresh command. In this manner, a single-bit error that is capable of being corrected is generated such that such error generated in data read from the memory array 1110 is detected and corrected by the ECC 1170 that provides error-corrected data via the RD path 1182.

FIG. 2A illustrates an example in which the auto refresh cycle information is stored in a non-volatile storage unit 1160 for being provided to the external controller when the DRAM chip 1100 is operating. In this case, the external controller determines the period of the refresh cycle. FIG. 2B illustrates an example in which the DRAM chip 1100 directly increases the frequency of the auto refresh cycle therein without any change on the external controller side.

For example, the DRAM chip 1100 refreshes the pages of all banks at intervals of 64 ms according to a specification of the DRAM chip 1100. In that case, pages of all banks connected to a specific word-line are simultaneously refreshed every time a refresh command is received. In addition, the address of pages to be refreshed is sequentially increased one by one by an internal counter. In FIG. 2B, an external controller provides a refresh command every 64 ms according to the specification of the DRAM chip 1100. However, the DRAM chip 1100 refreshes only some banks when the refresh command is received with the effect of internally increasing the period of the auto refresh cycle.

FIG. 2B illustrates an example of doubling the period of the auto refresh cycle. In FIG. 2B, the pages of some banks (banks A and B) are activated and refreshed during a refresh cycle, and the pages of the remaining banks (banks C and D) are activated and refreshed during the next refresh cycle. Accordingly, all of the banks (banks A, B, C, and D) are refreshed with a period (128 ms) that is twice the refresh period (64 ms) of the specification. The period of the auto refresh cycle is determined by adjusting the number of banks to be selected in response to each refresh command.

Figure 3:
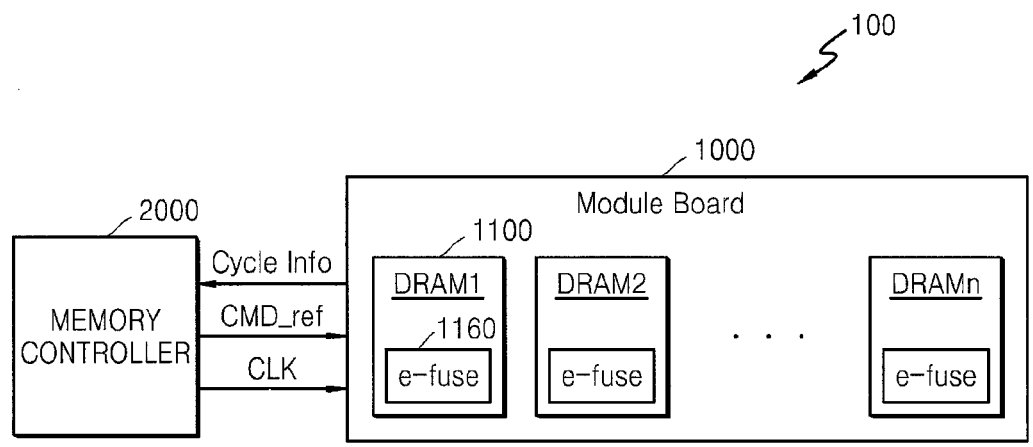
FIG. 3 is a block diagram of a memory system with auto refresh cycle information stored in at least one DRAM chip, according to an example embodiment of the present invention.

FIG. 3 is a block diagram of the memory system 100 with the auto refresh cycle information being stored in the DRAM chip 1100. In FIG. 3, auto refresh cycle information (Cycle Info) determined during the DRAM chip test operation is stored in the non-volatile storage unit 1160 within the DRAM chip 1100 mounted on the memory module 1000. The cycle information storage unit 1160 is implemented as a non-volatile memory or as either an anti-fuse or an electrical fuse (e-fuse). For example in FIG. 3, the cycle information storage unit 1160 is implemented as an e-fuse.

During an initial operation of the memory system 100, the auto refresh cycle information Cycle Info is provided to the memory controller 2000 from the cycle information storage unit 1160. The memory controller 2000 generates and provides to the memory module 1000 auto refresh commands CMD_ref with a period as indicated by the auto refresh cycle information.

In this manner, the period of the auto refresh commands CMD_ref is adjusted according to the auto refresh cycle information such that bit error in the data of the DRAM chip 1100 is capable of being corrected by an ECC (error correction circuit, not shown in FIG. 3). Thus, undue power consumption from the auto refresh operation is reduced while error within the DRAM chip 1100 is still capable of being corrected.

Figure 4:
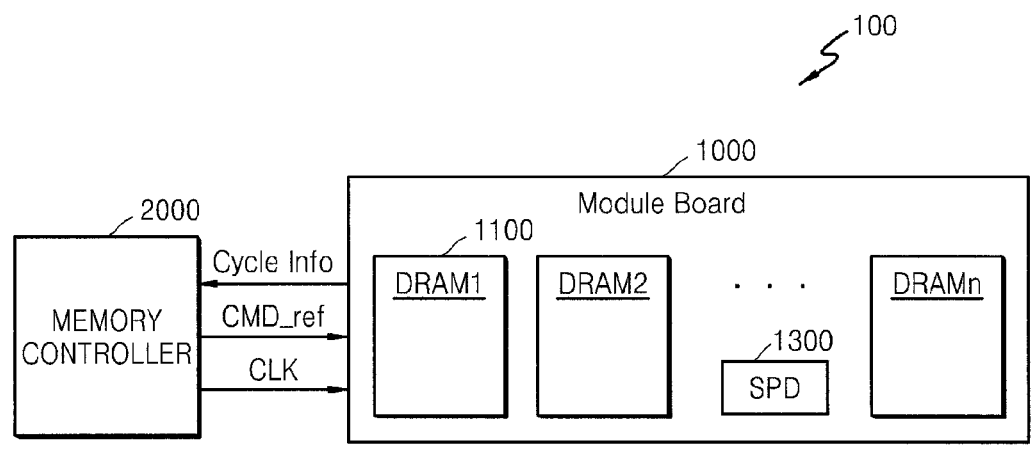
FIG. 4 is a block diagram of a memory system with auto refresh cycle information stored in a serial presence detect (SPD) device of a memory module, according to an example embodiment of the present invention.

FIG. 4 is a block diagram of the memory system 100 in which auto refresh cycle information is stored in a serial presence detect (SPD) device 1300 of the memory module 1000, according to an alternative embodiment of the present invention. When the memory module 1000 is a registered dual in-line memory module (RDIMM) or the like for servers, the memory module 1000 includes the SPD device 1300 that is non-volatile for storing corresponding module information and/or information about the DRAM chip 1100.

For example, the SPD device 1300 includes a non-volatile memory (such as EEPROM) that stores various information about the DRAM chip 1100 (such as a number of row and column addresses, a data width, a number of ranks, a memory density per rank, a number of memory devices, a memory density of each memory device, etc.) or the auto refresh cycle information Cycle Info for the DRAM chip 1100. During an initial operation of the memory system 100, the auto refresh cycle information Cycle Info from the SPD device 1300 is provided to the memory controller 2000 that generates and provides auto refresh commands CMD_ref to the memory module 1000 with a period as indicated by the auto refresh cycle information Cycle Info.

In an example, an auto refresh cycle is not set individually for each DRAM chip. Rather, a single auto refresh cycle is set for a plurality of DRAM chips with generation of bit errors being monitored during a test mode such that any chip failing to satisfy a predetermined condition is determined to be defective. Such auto refresh cycle information for the plurality of DRAM chips may be stored in one DRAM chip or an SPD device. In addition, auto refresh cycle information as defined according to a specification may be also stored in the DRAM chip or the SPD device.

Figure 5:
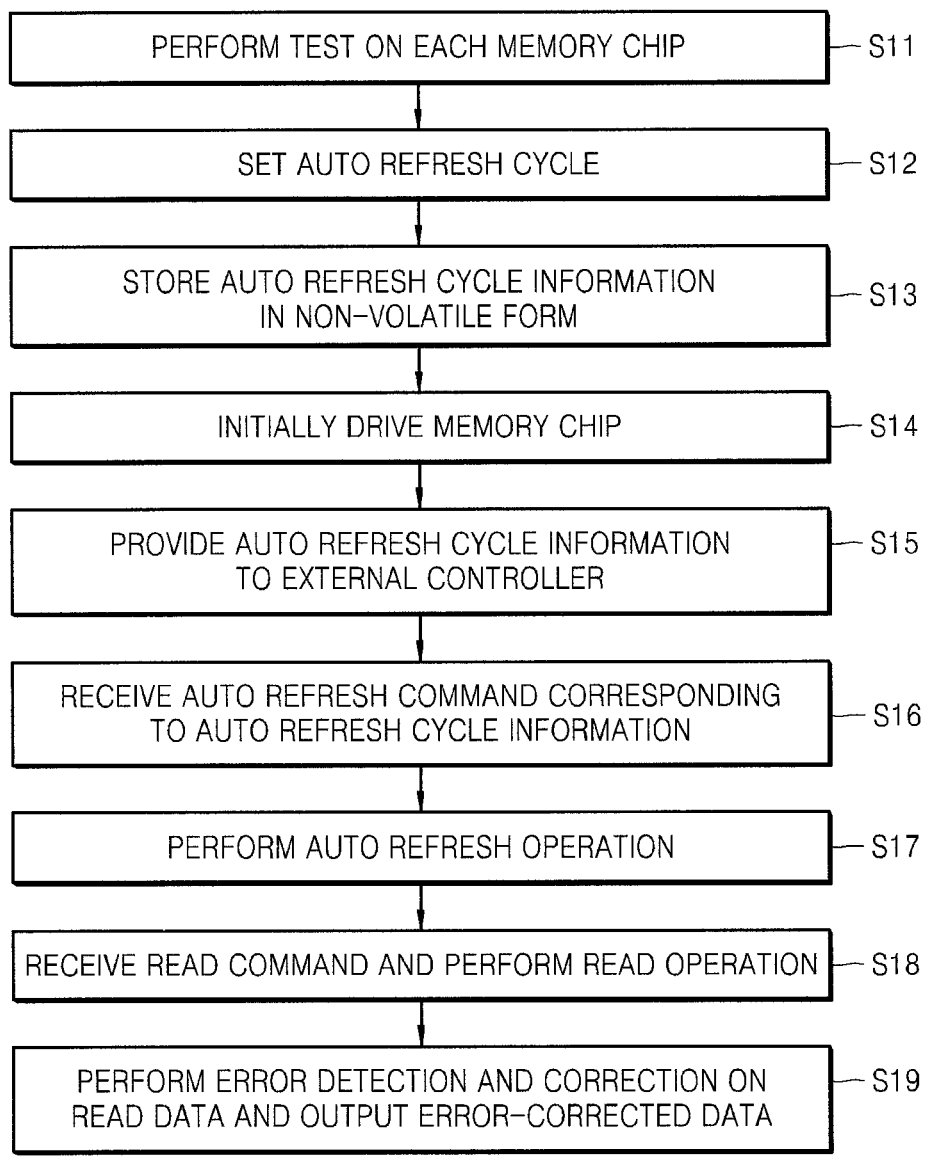
FIG. 5 is a flowchart of steps for performing a refresh operation according to auto refresh cycle information, according to an example embodiment of the present invention.

FIG. 5 is a flowchart of steps during operation of a semiconductor memory device, according to an example embodiment of the present invention. In FIG. 5, a test is performed on each memory chip such as each DRAM chip (S11) to determine auto refresh cycle information (S12) that is then stored in a non-volatile storage unit in a DRAM chip or in an SPD device of a memory module (S13). The auto refresh cycle information is determined to a level where bit error in the DRAM chip can be corrected by an ECC included in the DRAM chip. Although not shown in FIG. 5 during the test operation, a DRAM chip failing to satisfy a predetermined specification may be deemed as a defective chip.

When the DRAM chip is initialized (S14), the auto refresh cycle information is provided to an external controller (S15). The external controller generates auto refresh commands with a period indicated by the received auto refresh cycle information, and the DRAM chip receives such auto refresh commands (S16).

The DRAM chip performs auto refresh operations in response to the received auto refresh commands (S17). In addition, when a read command is received from an external source, a read operation is performed in response to the read command (S18). Furthermore, error detection and correction is performed on read data, and error-corrected data is provided (S19).

Figure 6:
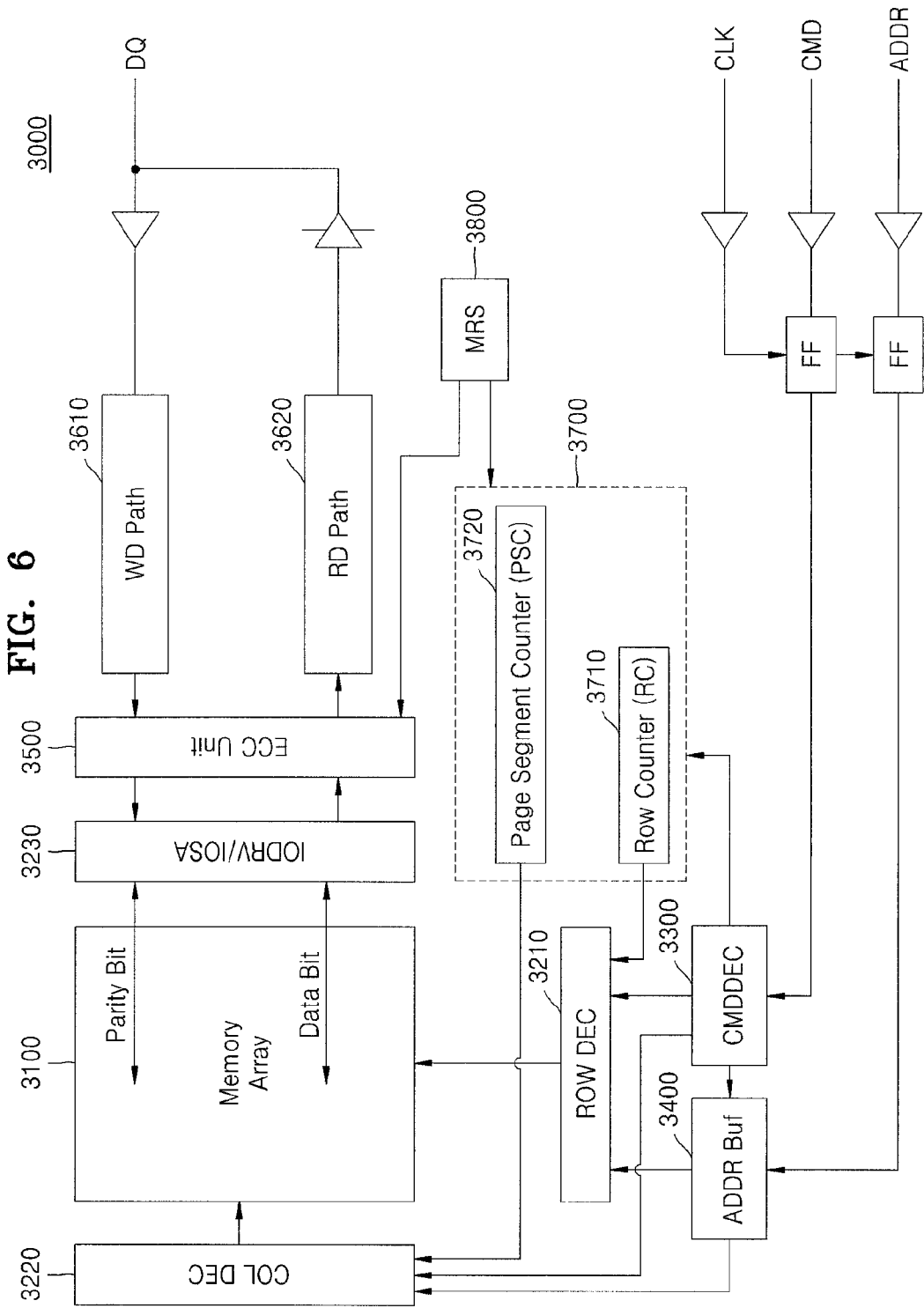
FIG. 6 is a block diagram of a semiconductor memory device with multiple counters for refresh and scrubbing operations, according to an example embodiment of the present invention.

FIG. 6 is a block diagram of a semiconductor memory device 3000 with refresh and scrubbing operations according to another embodiment of the present invention. FIG. 6 illustrates a DRAM chip as the semiconductor memory device 3000 that may be formed within a memory module and/or a memory system.

Referring to FIG. 6, the DRAM chip 3000 includes a memory array 3100 of DRAM cells, a row decoder 3210, a column decoder 3220, a drive/sense amplifier 3230, a command decoder 3300, an address buffer 3400, an ECC (error correction circuit) 3500, and RD (read data) and WD (write data) paths 3610 and 3620, respectively. The DRAM chip 3000 also includes a scrubbing refresh management unit 3700 for controlling a refresh with scrubbing operation and/or a refresh without scrubbing operation.

The scrubbing refresh management unit 3700 includes at least one counter such as a row counter (RC) 3710 and a page segment counter (PSC) 3720 for example. The DRAM chip 3000 further includes a mode register set (MRS) 3800 in which a MRS code for setting an operation mode is stored. During initialization of the DRAM chip 3000, an operation environment of various circuit blocks in the DRAM chip 3000 is set according to the MRS code from the MRS 3800.

FIG. 6 shows an example in which the MRS code is provided to the ECC 3500 and the scrubbing refresh management unit 3700. However, an operation environment of circuit blocks other than the ECC 3500 and the scrubbing refresh management unit 3700 may also be set according to the MRS code.

A simple Hemming code is mainly used in a DRAM chip because of minimization of a latency penalty or the like. However, only a single-bit error can be corrected with such a simple Hemming code. As the size of a DRAM cell gradually decreases, the probability of generation of multi-bit errors increases, and such multi-bit errors cannot be corrected with the simple Hemming code.

Accordingly, a refresh with scrubbing operation is performed by a DRAM chip for preventing multi-bit errors from accumulating, according to an aspect of the present invention. The refresh with scrubbing operation includes execution of both a refresh operation and a scrubbing operation. For example, a refresh with scrubbing operation results in a refresh from activation of a page of the memory array 3100 with detection of an error in the data of the activated page and writing back of error-corrected data to the memory array 3100.

Figure 7:
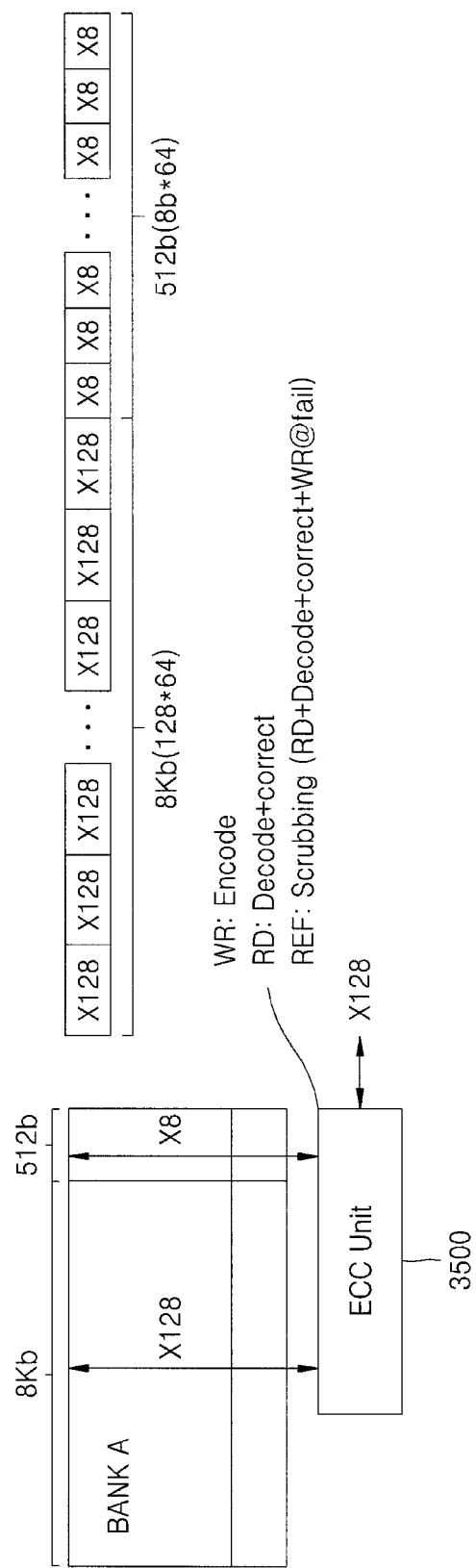
FIG. 7 is a block diagram illustrating a refresh with scrubbing operation, according to an example embodiment of the present invention.

FIG. 7 illustrates an example of a refresh with scrubbing operation. FIG. 7 illustrates an example with each page of a bank (BANK A) of the memory array 3100 having a size of 8 Kb (kilo-bits) and with each sub-page of the page having a size of 128 b (bits). A parity of 8 b (bits) is stored for each sub-page. Data from each sub-page of 128 b and corresponding parities of 8 b are sequentially read and provided to the ECC 3500.

A Hemming code may be used by the ECC 3500 for error detection and correction. The ECC method and a codeword length used during read/write operations may also be used for the refresh with scrubbing operation, according to an example embodiment of the present invention.

In an example embodiment of the present invention, the scrubbing refresh management unit 3700 controls a refresh with scrubbing operation in response to an external command. For example, the refresh with scrubbing operation may be performed in response to a newly defined external command (i.e., a specialized refresh and scrub command) or in response to a general known refresh command.

Each command is defined by a respective signal combination (for example, the settings of a combination of signals /CS, /RAS, /CAS, and /WE). For example, a respective signal combination may be newly defined for the refresh with scrubbing operation (i.e., a specialized refresh and scrub command) with signals /CS, /RAS, /CAS, and /WE each being set to one of logic high and low levels as may be detected by the memory controller and the memory device. Alternatively, the refresh with scrubbing operation may be performed in response to a known predefined refresh command such as an auto refresh command or a self refresh command.

In response to a refresh with scrubbing command, a page is activated to become refreshed. In addition for scrubbing some or all sub-pages of the page, data from the sub-pages and corresponding parities are read and provided to the ECC 3500. The ECC 3500 performs error detection and correction on such data pieces. Error-corrected data is written back to a corresponding location on the memory array 3100. A write back operation may be performed regardless of detection or non-detection of error. Alternatively, error-corrected data may be written back only when an error is detected.

The RC (row counter) 3710 performs a counting operation in response to the refresh with scrubbing command for indicating a page (for example, an n-th page) of the memory array 3100 to be activated. The PSC (page segment counter) 3720 performs a counting operation to indicate at least one sub-page in the activated page to be sequentially selected. A scrubbing operation (with error detection/correction and data write back) is performed on the selected sub-page. Thereafter, the activated page is deactivated. When another refresh with scrubbing command is received, a next page (for example, an (n+1)th page) of the memory array 3100 is activated from the counting operation of the RC 3710.

The number of sub-pages to be refreshed with scrubbing in response to the newly defined refresh with scrubbing command (i.e., a specialized refresh and scrub command) may be set differently from the number of sub-pages to be refreshed with scrubbing in response to a pre-defined refresh command. The refresh with scrubbing command may be provided to the semiconductor memory device so that all of the pages of the memory array 3100 are activated at least once each refresh cycle (for example, 64 ms) as defined in a specification of the memory device.

The receiving cycle of the refresh with scrubbing commands may be set to be long enough to satisfy the refresh cycle as defined in the specification of the memory device. The longer receiving cycle of the refresh with scrubbing command allows for a higher number of sub-pages selected for scrubbing in response to a single refresh with scrubbing command.

On the other hand when a predefined refresh command such as an auto refresh command is used, a receiving cycle of the auto refresh command is defined according to the specification of the memory device. In that case, a number of sub-pages capable of being scrubbed within the receiving cycle may be selected but limited to the time period defined according to the specification of the memory device.

For example when the newly defined refresh with scrubbing command is used, a scrubbing operation may be performed on all of the sub-pages included in a single page in response to a single refresh with scrubbing command. On the other hand when the auto refresh command is used, a scrubbing operation may be performed on a single sub-page in response to a single refresh command.

The scrubbing operation increases power consumption of the DRAM chip 3000. Thus, the scrubbing operation should not be performed when data errors are not generated regardless of the scrubbing operation or when only error-correctable errors are generated. When the newly defined refresh with scrubbing command is generated in addition to a predefined existing refresh command, the scrubbing refresh management unit 3700 sequentially performs page activation, sub-page selection, error-detection, and write-back in response to the newly defined refresh with scrubbing command.

When the predefined existing refresh command is received, a page is activated and a refresh operation is performed thereon without a scrubbing operation in response to the predefined existing refresh command. Accordingly, the memory controller controls when a scrubbing operation is not performed by generating the predefined existing refresh command instead of the newly defined refresh with scrubbing command.

Alternatively when a refresh with scrubbing operation is desired to be performed using just the predefined existing refresh command, execution or non-execution of a scrubbing operation may be set. To that end, the MRS 3800 includes an MRS code associated with the scrubbing operation and such code may be set to indicate whether scrubbing is to be performed.

For example when a scrubbing execution mode is set in the MRS 3800, a refresh with scrubbing operation is performed in response to the predefined existing refresh command such as an auto or self refresh command of the memory device. On the other hand when a scrubbing non-execution mode is set in the MRS 3800, scrubbing-related circuits in the ECC 3500 and/or the scrubbing refresh management unit 3700 are disabled such that refresh without scrubbing is performed on the activated page in response to the refresh command. In that case, data error detection, write back, and the like associated with data scrubbing as described above are not performed.

An existing refresh control unit and/or an existing address counter (not shown in FIG. 6) may be used for the refresh without scrubbing operation in response to the predefined existing refresh command. The scrubbing refresh management unit 3700 of FIG. 6 is further included in addition to the existing refresh control unit and/or the existing address counter according to an embodiment of the present invention. The scrubbing refresh management unit 3700 operates in response to the newly defined refresh with scrubbing command, or the scrubbing refresh management unit 3700 is enabled or disabled according to the MRS code set in the MRS 3800.

Figure 8A:
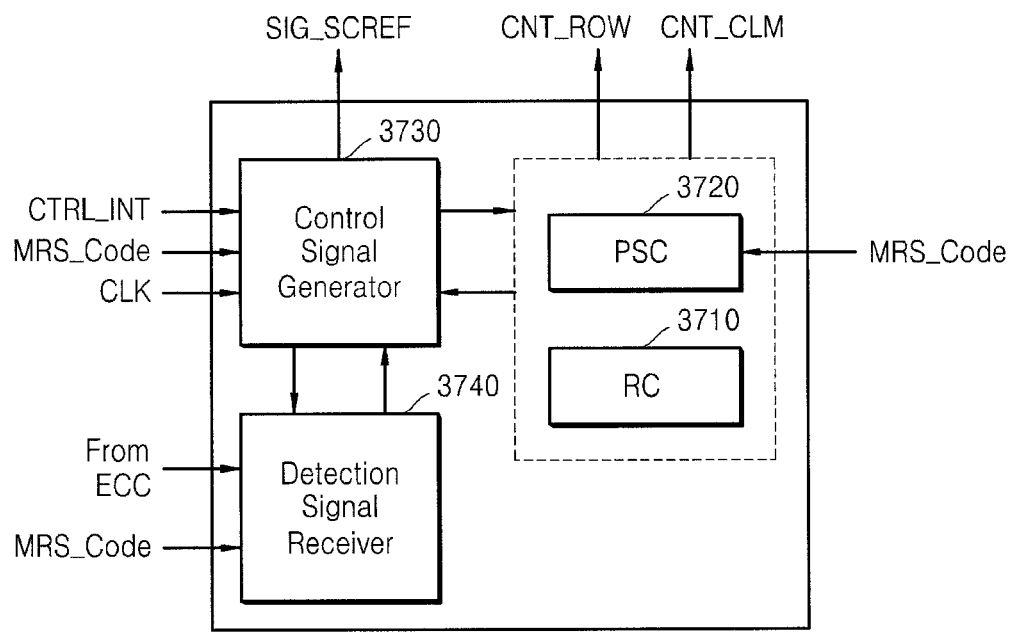
FIGS. 8A and 8B are each a block diagram of an example scrubbing refresh management unit of FIG. 6, according to example embodiments of the present invention.
Figure 8B:
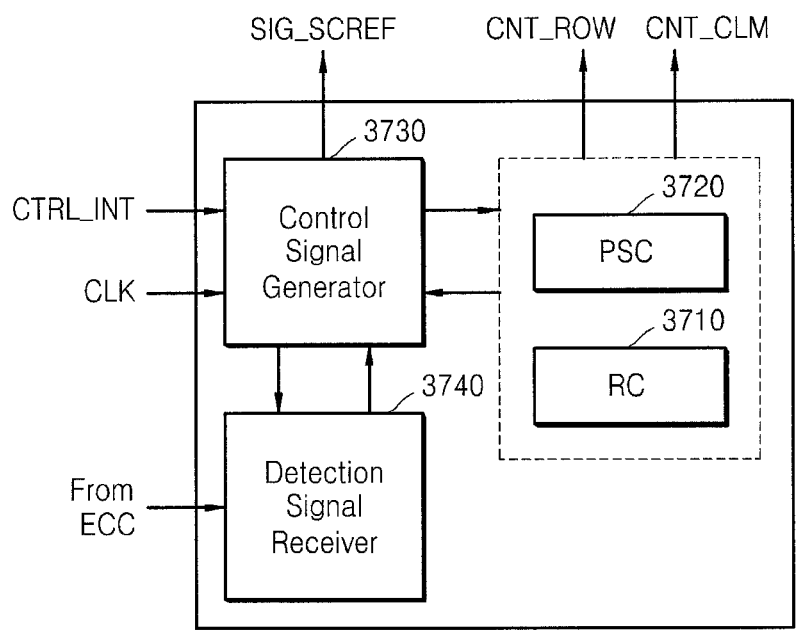

FIGS. 8A and 8B are each a block diagram of the scrubbing refresh management unit 3700 of FIG. 6, according to example embodiments of the present invention. FIG. 8A illustrates the scrubbing refresh management unit 3700 with a scrubbing refresh mode set according to an MRS code. In FIGS. 8A and 8B, the scrubbing refresh management unit 3700 includes a control signal generator 3730 that generates a control signal for managing the scrubbing refresh operation and a detection signal receiver 3740 that receives an error detection result from the ECC. As described above, the scrubbing refresh management unit 3700 also includes the RC 3710 and the PSC 3720.

The control signal generator 3730 receives an internal control signal CTRL_INT, a control signal CLK such as a clock signal, and the like, and generates various control signals SIG_SCREF for performing the refresh with scrubbing operation. When an external command for the refresh with scrubbing operation is received, the control signal generator 3730 controls the counting operations of the RC 3710 and the PSC 3720 in response to the internal control signal CTRL_INT.

The internal control signal CTRL_INT is generated from decoding the external command. The control signal generator 3730 generates the various control signals SIG_SCREF to control operations of components associated with the refresh with scrubbing operation such as the ECC. A location on a memory array on which a data read operation or a data write back operation for the refresh with scrubbing operation is to be performed is designated by counting signals CNT_ROW and CNT_CLM output by the RC 3710 and the PSC 3720, respectively.

According to the refresh with scrubbing operation, error detection is performed on data read from the memory array, and a result of the error detection is provided to the detection signal receiver 3740. According to the result of the error detection, error-corrected data is written back to the memory array.

In FIG. 8A, the setting of a scrubbing refresh mode is indicated by an MRS code MRS_Code during an initialization of the semiconductor memory device. The MRS code MRS_Code is provided to the control signal generator 3730, the detection signal receiver 3740, the PSC 3720, and the like. The detection signal receiver 3740 and the PSC 3720 may be disabled according to the MRS code MRS_Code, and the control signal generator 3730 performs a control operation according to the MRS code MRS_Code.

When the refresh with scrubbing mode is set, the scrubbing refresh management unit 3700 performs a refresh with scrubbing operation as described above in response to an external command (for example, a predefined refresh command such as an auto or self refresh command). On the other hand when the scrubbing refresh mode is not set, the scrubbing refresh management unit 3700 does not perform a scrubbing operation.

For example when a refresh command is received in that case, a page is activated for a refresh operation according to a counting operation of the row counter 3710. Furthermore in that case, a series of scrubbing operations (such as data error detection and correction and writing-back of corrected data and the like for data scrubbing) are skipped.

In FIG. 8A, the scrubbing operation can be enabled or disabled according to the MRS code MRS_Code. In contrast in FIG. 8B, the enablement or disablement of the scrubbing operation may be determined from the type of command received from an external source.

Figure 9A:
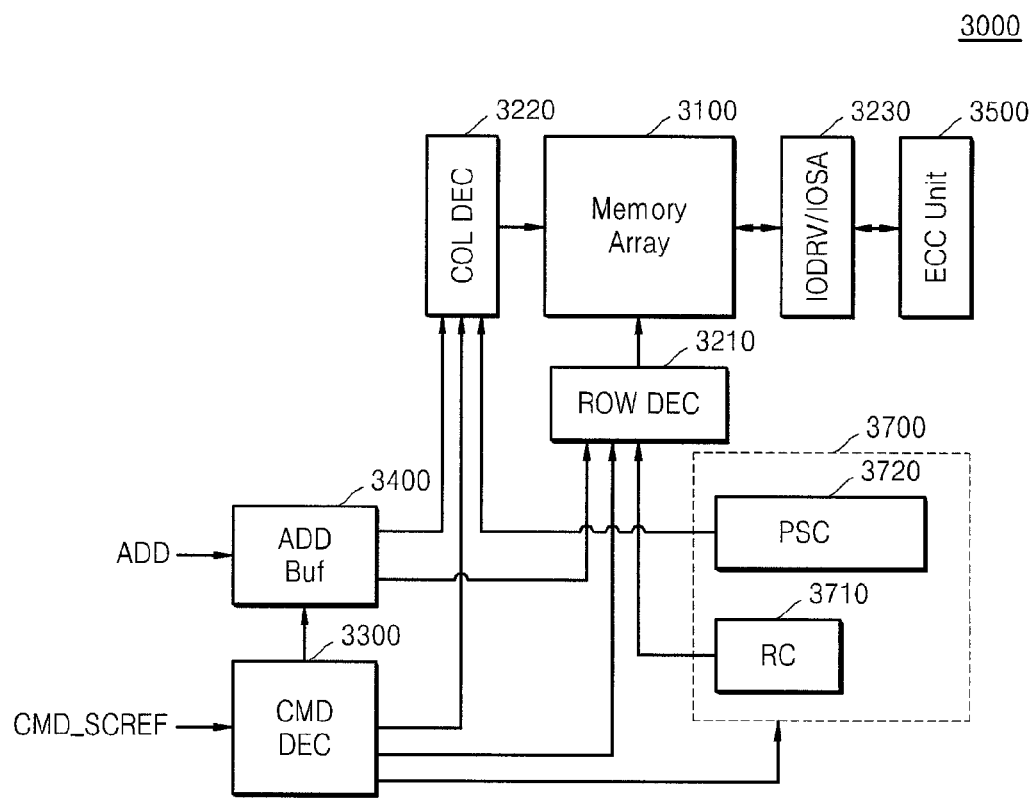
FIG. 9A is a block diagram and 9B is a timing diagram for illustrating a refresh with scrubbing operation from a newly defined command, according to example embodiments of the present invention.
Figure 9B:
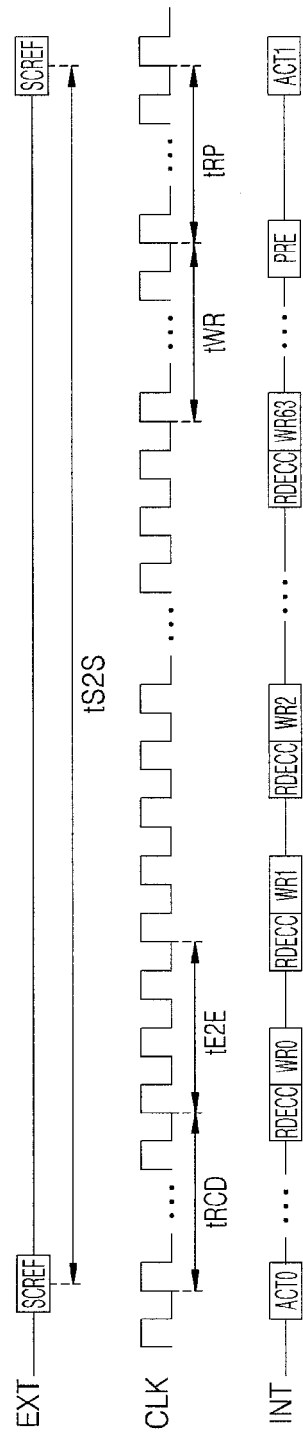

FIGS. 9A and 9B show a block diagram and a timing diagram of the memory device 3000 performing a refresh with scrubbing operation according to a newly defined command. Referring to FIG. 9A, the command decoder 3300 receives and decodes a refresh with scrubbing command CMD_SCREF from an external source to generate an internal command that is provided to the scrubbing refresh management unit 3700.

The counting operations of the RC 3710 and the PSC 3720 are performed in response to this internal command and results of such counting operations are provided to the row decoder 3210 and the column decoder 3220, respectively. The RC 3710 and the PSC 3720 respond to the internal command received from the command decoder 3300 in FIG. 9A. However, the present invention may also be practiced with the RC 3710 and the PSC 3720 being controlled by another component in the scrubbing refresh management unit 3700 (for example, by the control signal generator 3730) as described above.

An external address ADD or an internally generated address ADD is provided to the row decoder 3210 and the column decoder 3220 via the address buffer 3400. Data and parities of the memory array 3100 are provided to the ECC 3500 via the drive/sense amplifier 3230 and sequentially undergo data error detection/correction and a write back operation.

Referring to FIG. 9B, a page is activated and refreshed every time a refresh with scrubbing command SCREF is received (ACT0). In addition, a plurality of sub-pages of the activated page is sequentially selected. For example, a first sub-page of the activated page is selected, error detection/correction is performed on data of the first sub-page, and corresponding error-corrected data is written back to the memory array 3100 (WR0).

Thereafter when 64 sub-pages are defined for each page, data error detection/correction operations and write back operations are sequentially performed on second through sixty fourth sub-pages (WR1 through WR63). When the data error detection/correction operations and write back operations for the page corresponding to the refresh with scrubbing command SCREF are completed, the page is deactivated with a pre-charge of the page (PRE).

Subsequently when a next refresh with scrubbing command SCREF is received, another page is activated and refreshed (ACT1). In addition, scrubbing operations are performed on the corresponding 64 sub-pages of this activated page. When the memory array 3100 includes a plurality of banks, the refresh with scrubbing operations on respective pages of all of the banks may be simultaneously performed.

FIG. 9B shows scrubbing operations being sequentially performed on all sub-pages of a single page in response to a single refresh with scrubbing command SCREF. However, the present invention may also be practiced with scrubbing operations being performed on only some of the sub-pages of the single page in response to a single refresh with scrubbing command SCREF.

In FIGS. 9A and 9B, a newly defined refresh with scrubbing command is used. The frequency of generating the refresh with scrubbing command may be set in consideration of a trade-off between power consumption and error accumulation prevention.

Figure 10:
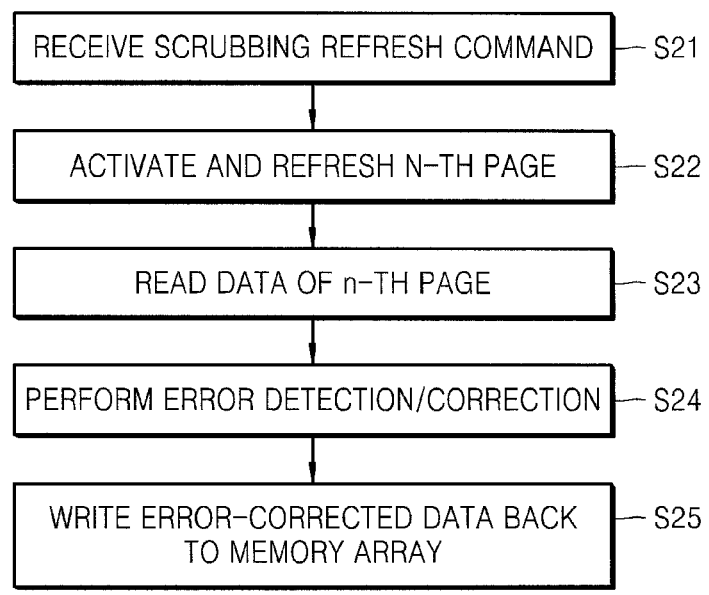
FIG. 10 is a flowchart of steps for performing a refresh with scrubbing operation in a semiconductor memory device of FIG. 9A, according to an example embodiment of the present invention.

FIG. 10 is a flowchart of steps during operation of the semiconductor memory device 3000 of FIG. 9A, according to an example embodiment of the present invention. Referring to FIGS. 9A and 10, the DRAM chip 3000 receives a refresh with scrubbing command from an external controller (S21). A page (for example, an n-th page) of the memory array 3100 is activated and refreshed in response to the refresh with scrubbing command (S22).

Data of the n-th page is read (S23), and an error detection/correction operation is performed on the read data (S24). Error-corrected data is written back to the memory array 3100 according to a result of the error detection (S25). As described above, when an activated page includes a plurality of sub-pages, scrubbing operations may be sequentially performed on all of the sub-pages or on only some of the sub-pages in response to a single refresh with scrubbing command.

The number of sub-pages that are scrubbed may be determined by a period of generation of the refresh with scrubbing commands. Such a period of generation of the refresh with scrubbing commands may be set during testing of the memory device 3000 in consideration of a trade-off between power consumption and error accumulation prevention.

Figure 11:
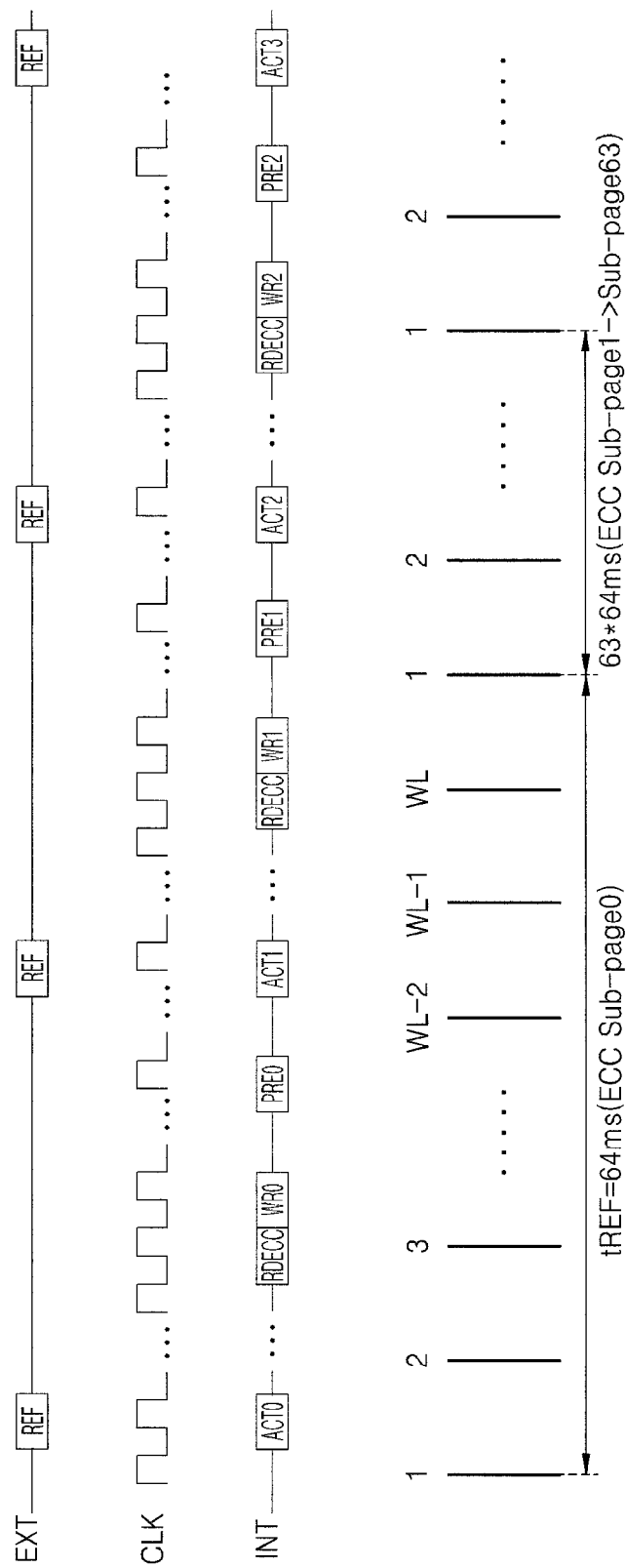
FIG. 11 is a timing diagram for illustrating a refresh with scrubbing operation, according to an example embodiment of the present invention.

FIG. 11 is a timing diagram of a refresh with scrubbing operation performed in response to a predefined existing refresh command such as an auto or self refresh command for example. FIG. 11 illustrates an example where an auto refresh command REF is used as the refresh command. However, the present invention may also be practiced with a self refresh command.

For example, a self refresh command is not provided from an external source but is generated within a semiconductor memory device at a predetermined cycle. When an externally provided command has a predetermined signal combination, the semiconductor memory device enters a self refresh mode, and the self refresh command for performing a self refresh operation is internally generated within the semiconductor memory device in the self refresh mode.

Referring to FIG. 11, a page is activated and refreshed every time the auto refresh command REF is received (ACT0). In addition, a sub-page such as a first sub-page of the activated page is selected. Error detection/correction is performed on data of the first sub-page, and error-corrected data is written back to the memory array 3100 (WR0). When the write back operation WR0 in response to the current auto refresh command REF is completed, the first page is deactivated and pre-charged (PRE0).

In other words, the entire activated first page is refreshed, but just the selected first sub-page is scrubbed with error detection/correction and write back operations in response to the auto refresh command REF. When the memory array 3100 includes a plurality of banks, similar refresh with scrubbing operations may be simultaneously performed on respective pages of all of the banks.

FIG. 11 shows a scrubbing operation being performed on one sub-page of an activated page in response to a single auto refresh command. However, the present invention may also be practiced with scrubbing operations being performed on at least two of the sub-pages of the activated page depending on a period of generation of the auto refresh commands REF.

Thereafter when a next auto refresh command REF is received, a second page is activated and refreshed, and a first sub-page of the second page is selected. Data of the selected first sub-page of the second page undergoes error detection/correction, and error-corrected data is written back to the memory array 3100 (WR1). When the write back operation WR1 is completed, the second page is deactivated and pre-charged (PRE1).

After all pages of the memory array 3100 have been completely activated and refreshed with such scrubbing of the respective first sub-pages, respective second sub-pages of the activated pages are sequentially selected for scrubbing at the next refresh cycle. Similarly after all pages of the memory array 3100 have been completely activated and refreshed with such scrubbing of the respective second sub-pages, respective third sub-pages of the activated pages are sequentially selected for scrubbing at the next refresh cycle.

FIG. 11 illustrate an example of a refresh cycle tREF being defined as 64 ms during which all pages of a memory bank are activated and refreshed. Also FIG. 11 illustrates an example of a single page including 64 sub-pages. Further in FIG. 11, an error detection/correction operation and a write back operation are performed on a single sub-page per auto refresh command. In that case, scrubbing of all sub-pages in all pages of a memory bank is performed in 64*64 ms. Data scrubbing does not need to be performed as frequently as refreshing of the memory array such that data scrubbing may be performed with more time. In FIG. 11, the DRAM chip itself performs a refresh with scrubbing operation without a specialized new refresh and scrub command.

Figure 12:
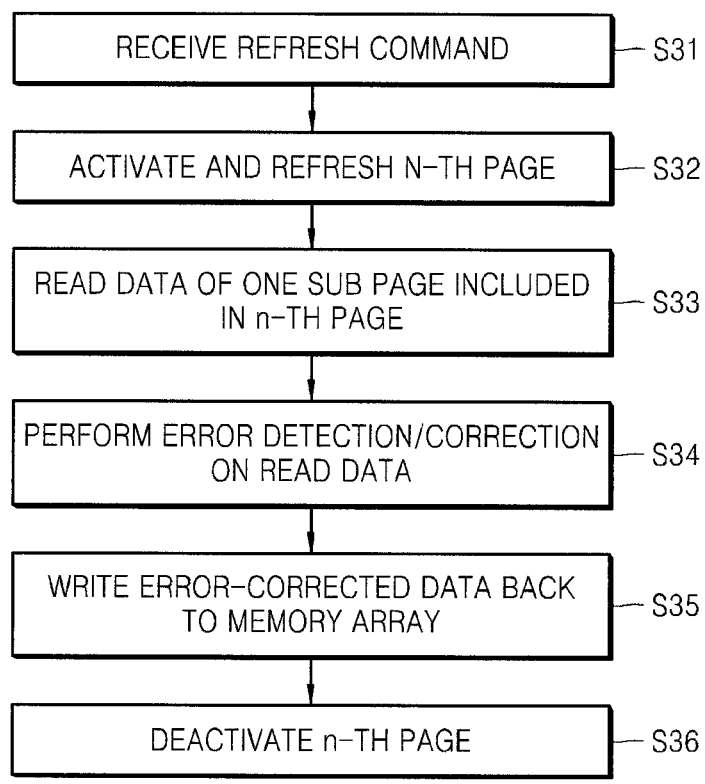
FIG. 12 is a flowchart of steps for performing a refresh with scrubbing operation by sub-pages according to the timing diagram of FIG. 11, according to an example embodiment of the present invention.

FIG. 12 is a flowchart of steps during a refresh with scrubbing operation of FIG. 11 in the semiconductor memory device, according to an embodiment of the present invention. Referring to FIGS. 11 and 12, the semiconductor memory device such as a DRAM chip receives a refresh command from an external controller (S31). A page (for example an n-th page) of the memory array is activated and refreshed in response to the refresh command (S32).

Data of a selected one of a plurality of sub-pages included in the n-th page is read (S33), and an error detection/correction operation is performed on such read data (S34). Corresponding error-corrected data is written back to the memory array according to a result of the error detection (S35). When scrubbing of one or more sub-pages of the activated n-th page is completed, the n-th page is deactivated (S36).

Figure 13A:
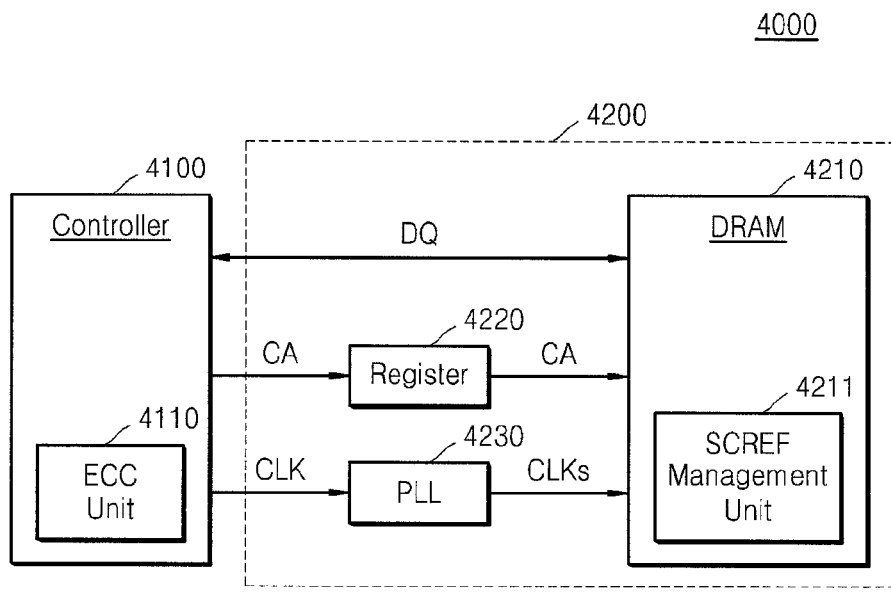
FIGS. 13A and 13B are each a block diagram of a semiconductor memory system with a refresh management unit, according to example embodiments of the present invention.
Figure 13B:
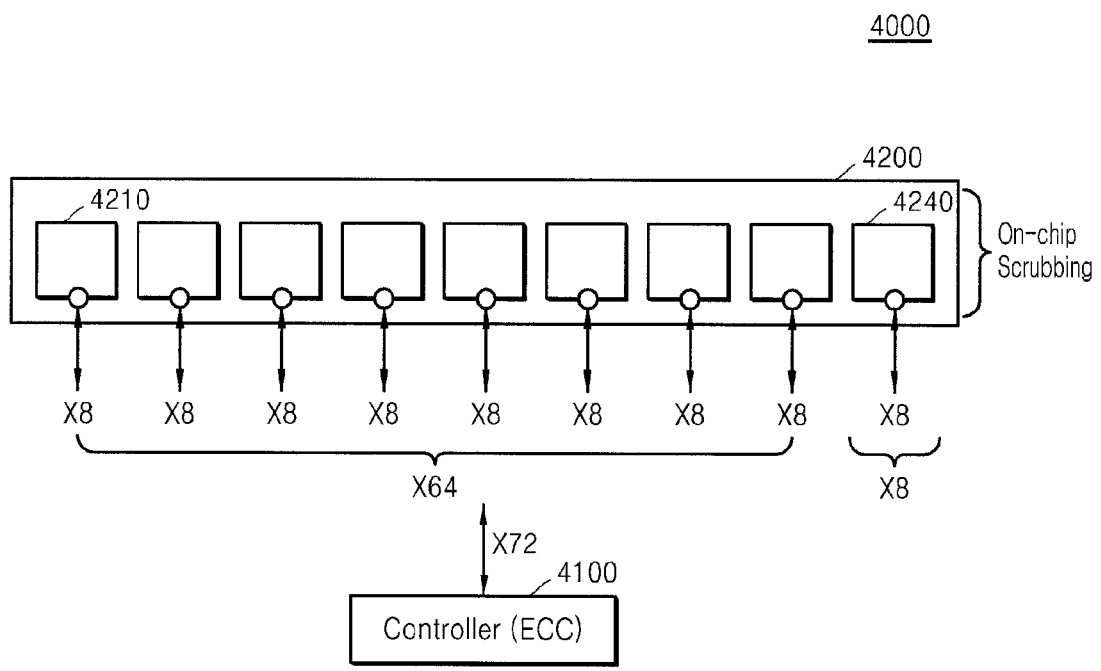

FIGS. 13A and 13B are block diagrams of a memory system 4000 according to another embodiment of the present invention. FIGS. 13A and 13B illustrate an embodiment with a scrubbing refresh management unit 4211 formed within a DRAM chip 4210 and with an error correction circuit being formed in a controller 4100.

Referring to FIG. 13A, the memory system 4000 includes a controller 4100 and a memory module 4200 having at least one DRAM chip 4210. The controller 4100 includes an ECC (error correction circuit) 4110 that receives data and/or a parity from the memory module 4200 and performs error detection and correction on the data. In addition, each DRAM chip 4210 includes a scrubbing refresh management unit 4211 for managing the refresh with scrubbing operation.

As described above with reference to the previous embodiments, an additional ECC (not shown in FIGS. 13A and 13B) may be included in each DRAM chip 4210 for performing a scrubbing operation on the data of a sub-page selected during a refresh with scrubbing operation. FIG. 13A illustrates an example of the memory module 4200 as a RDIMM that is for a server with a register 4220 and a phase locked loop (PLL) 4230 being mounted on a module board of the memory module 4200.

The controller 4110 and the memory module 4200 communicate with each other by exchanging data DQ, a command/address CA, and a clock signal CLK via various system buses. The data DQ is provided to each DRAM chip 4210 via a data bus (not shown) on the module board, and the register 4220 buffers and provides the command/address CA to each DRAM chip 4210. The PLL 4230 receives the clock signal CLK, generates one or more clock signal CLKs by adjusting the phase of the original clock signal CLK, and provides phase-adjusted clock signals CLKs to each DRAM chip 4210.

FIG. 13B is a block diagram of the memory module 4200 having a plurality of DRAM chips 4210 and a single ECC chip 4240. The ECC chip 4240 may be implemented as a DRAM chip and stores a parity for error detection and correction. Data read from the DRAM chips 4210 and the parity read from the ECC chip 4240 are provided to the controller 4110, and the controller 4110 detects and corrects an error in the read data.

For a refresh with scrubbing operation, a newly defined refresh with scrubbing command or a predefined existing refresh command is provided from the controller 4110 to the memory module 4200. The DRAM chip 4210 performs the refresh with scrubbing operation in response to the such commands. To achieve this, data and/or parities read from a memory array (not shown) of each DRAM chip 4210 are provided to an ECC included in each DRAM chip 4210. According to a result of the error detection, when an error bit is included in the data, the error bit is corrected to generate error-corrected data, and the error-corrected data is written back to the memory array.

In FIGS. 13A and 13B, an error detection/correction operation for refresh with scrubbing is separated from an error detection/correction operation for correcting a single-bit error of read data. In this case, the refresh with scrubbing operation does not affect latency to result in a stronger error detection/correction for the refresh with scrubbing operation. For example, multi-bit errors may be corrected during the refresh with scrubbing operation while single-bit errors are corrected by the controller 4110 during a data read operation.

Figure 14A:
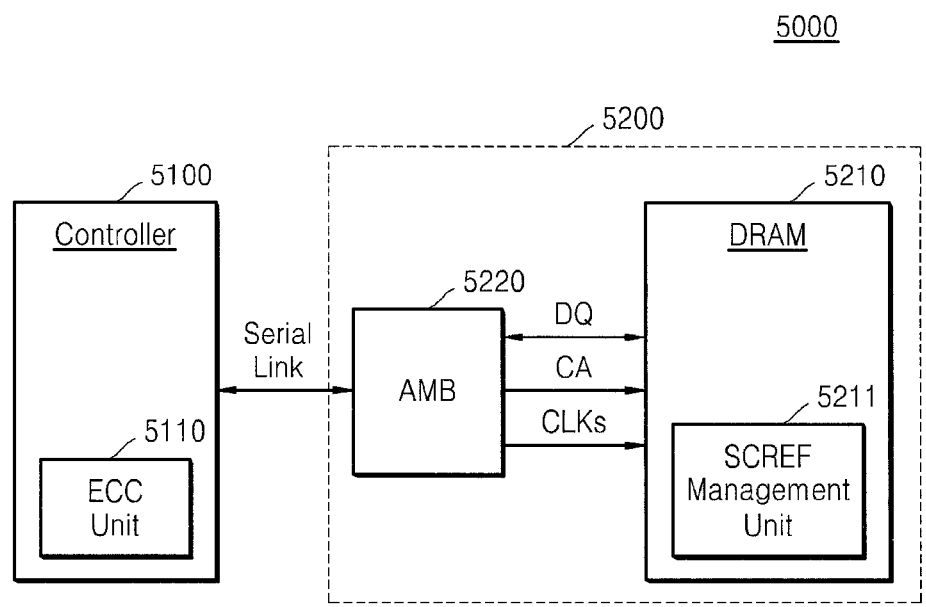
FIGS. 14A and 14B are each a block diagram of a semiconductor memory system with a refresh management unit, according to example embodiments of the present invention.
Figure 14B:
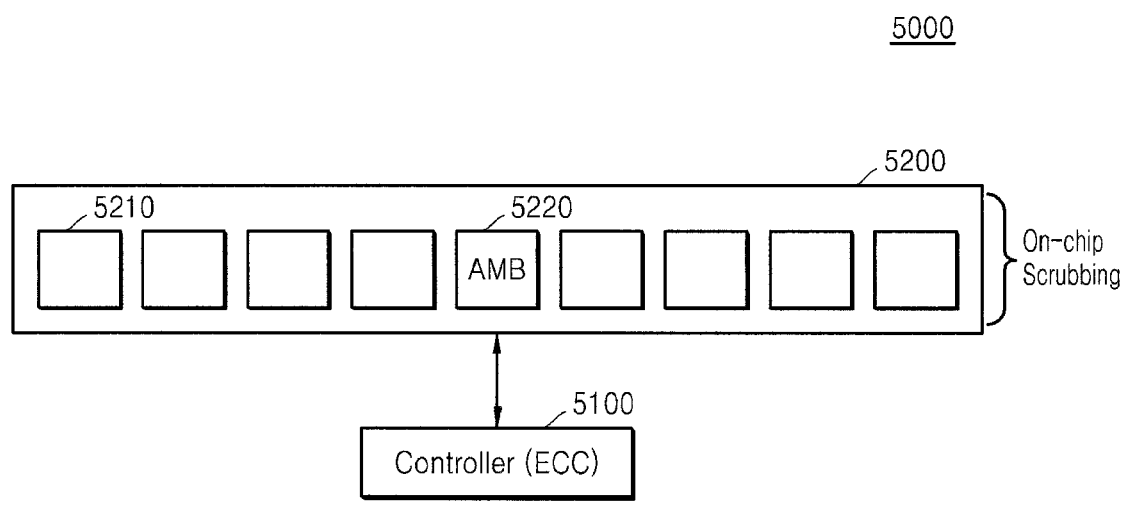

FIGS. 14A and 14B are block diagrams of a memory system 5000 with an advanced memory buffer (AMB) 5220, according to another example embodiment of the present invention. FIGS. 14A and 14B illustrate another example of the refresh with scrubbing operation being performed within a DRAM chip while error correction of read data is performed in a controller 5100. A memory module 5200 of FIG. 14A is implemented as a fully-buffered DIMM (FBDIMM).

Referring to FIG. 14A, the memory system 5000 includes a controller 5100 and the memory module 5200 having at least one DRAM chip 5210 and the advanced memory buffer (AMB) 5220. The memory module 5200 of FBDIMM (fully buffered DIMM) type communicates serially with the controller 5100 that is connected to the AMB 5220 in a point-to-point manner. Accordingly, the number of memory modules 5200 to be connected to the memory system 5000 may be increased for achieving a large capacity of the memory system 5000. In addition, the FBDIMM 5200 may operate with high speed using a packet protocol.

The controller 5100 includes an ECC (error correction circuit) 5110 which receives data and/or a parity from the memory module 5200 and performs error detection and correction on the data. Furthermore, each DRAM chip 5210 includes a scrubbing refresh management unit 5211 for performing a refresh with scrubbing operation. As described above with reference to the previous embodiment, an ECC (error correction circuit not shown in FIGS. 14A and 14B) for error detection/correction may be included in each DRAM chip 5210 for performing a scrubbing operation on a sub-page selected during the refresh with scrubbing operation.

FIG. 14B is a block diagram for an example implementation of the memory module 5200 of FIG. 14A. Referring to FIG. 14B, the memory module 5200 includes a plurality of DRAM chips 5210 and the AMB 5220. During data reading, data and/or parity read from the DRAM chips 5210 are provided to the controller 5100 via the AMB 5220, and the ECC 5110 of the controller 5100 detects and corrects a single-bit error in the read data.

In addition, the DRAM chip 5210 performs a refresh with scrubbing operation in response to a newly defined refresh with scrubbing command or a predefined existing refresh command from the controller 5100. During the refresh with scrubbing operation, data and/or a parity read from a memory array (not shown) of each DRAM chip 5210 are provided to an ECC included in each DRAM chip 5210. According to a result of the error detection, when an error bit is detected in the data, the error bit is corrected to generate error-corrected data that is written back to the memory array.

In the embodiment of FIGS. 14A and 14B, an error detection/correction operation for refresh with scrubbing is separated from an error detection/correction operation for correcting a single-bit error of read data. For example, multi-bit errors may be corrected during the refresh with scrubbing operation while single-bit errors are corrected by the controller 4110 during a data read operation. Thus, an uncorrectable error (for example, a multi-bit error) may be prevented from being generated due to a reduction in the size of a DRAM cell.

FIGS. 13A, 13B, 14A, and 14B illustrate the memory module being one of a RDIMM or a FBDIMM. However, the present invention is not limited to such example memory module types. A refresh with scrubbing operation of above described embodiments of the present invention may be applied to various types of semiconductor memories, memory modules, systems, and the like such as to different types of memory modules including a single in-line memory module (SIMM), a dual in-line memory module (DIMM), a small-outline DIMM (SO-DIMM), an unbuffered DIMM (UDIMM), a rank-buffered DIMM (RBDIMM), a mini-DIMM, or a micro-DIMM.

Figure 15:
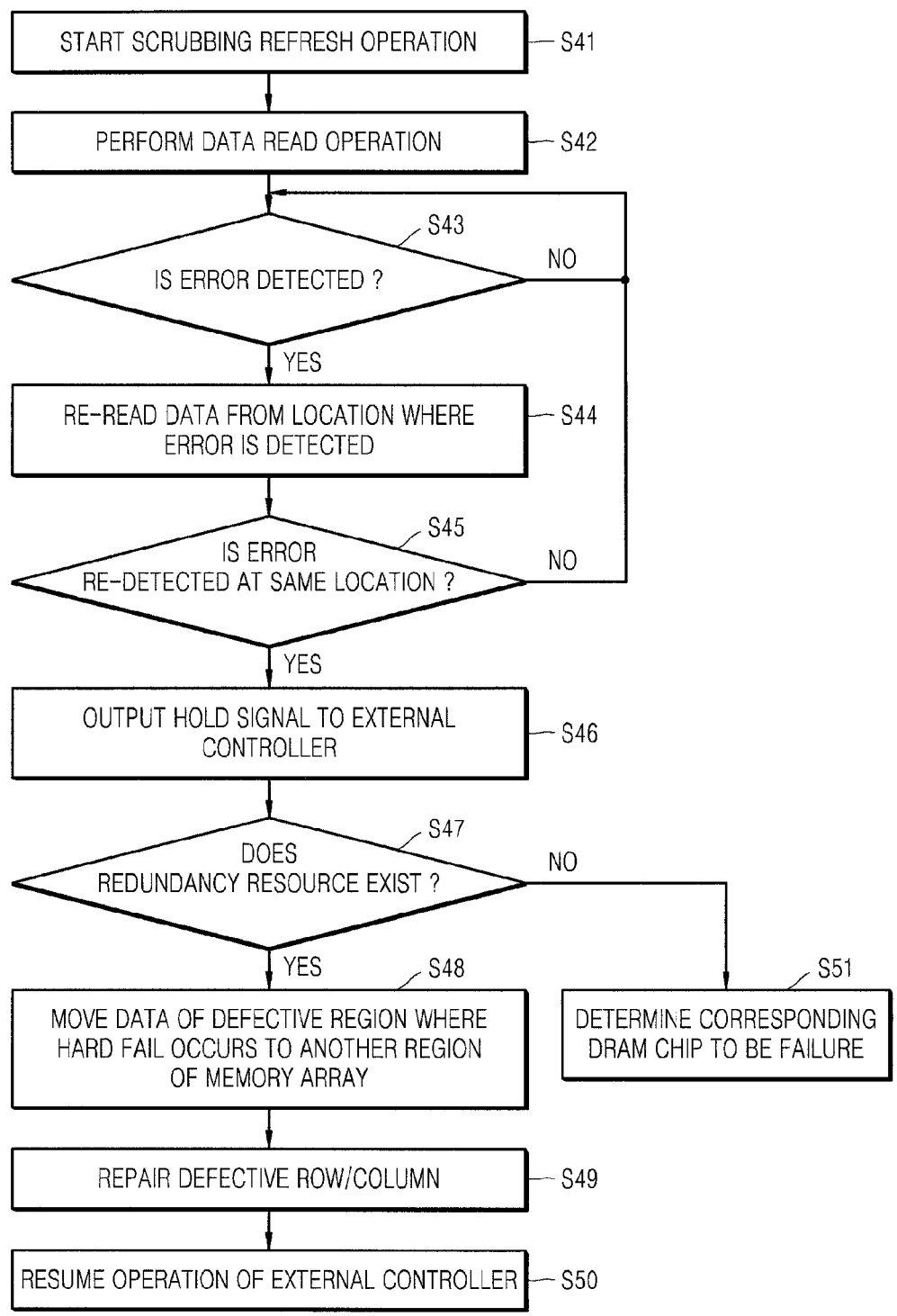
FIG. 15 is a flowchart of steps illustrating repairing for a hard fail detected during a refresh with scrubbing operation, according to an example embodiment of the present invention.

FIG. 15 is a flowchart of steps illustrating repairing for a hard fail detected during a refresh with scrubbing operation, according to an example embodiment of the present invention. While the refresh with scrubbing operations are continuously performed, overall error statistics for a memory array may be obtained. In particular, data error due to a hard fail from a physical defect instead of a soft fail may be detected for preventing future error by repairing a row and/or a column of the memory array having the hard fail.

Referring to FIG. 15, after a newly defined refresh with scrubbing command or predefined existing refresh command is received from an external controller, a refresh with scrubbing operation starts (S41). Accordingly, a data read operation on the memory array is performed for data scrubbing (S42), and an error detection operation is performed on such read data (S43).

When no errors are detected, the error detection operation is performed again on next read data (S43). On the other hand if an error is detected, data is read again from a location from which the error is detected (S44), and an error detection operation is performed on the re-read data (S45). When no errors are re-detected at the same location, an error detection operation is performed again on next read data (S43).

On the other hand, when an error is re-detected at the same location (S45), the error is determined to be due to a hard fail, and a hold signal requesting to pause a current operation is output to the external controller (S46). In FIG. 15, error occurrence is determined to be due to a hard fail when an error is detected twice at the same location. However, the present invention may be practiced with a different standard for determining the occurrence of the hard fail.

Thereafter, an operation is performed for replacing a defective region (for example, a row and/or column region) of the memory array having the hard fail with a redundancy region. First, availability of a redundancy resource to be used for such a replacement is determined (S47). If the redundancy resource exists, data of a defective region with the hard fail is moved to another region of the memory array (S48). Thereafter, the defective region is replaced by the redundancy resource, and the data is repaired by moving the data to the redundancy resource (S49). Subsequently, a request signal requesting the external controller to resume held operation is output (S50). On the other hand, if the redundancy resource does not exist, the corresponding DRAM chip having the hard fail is determined to be a failure (S51).

The above-described refresh with scrubbing operation may be equally or similarly applied to the present embodiment of FIG. 15. For example, although not illustrated in FIG. 15, when an error is detected in step S43 of detecting an error from read data, the error may be corrected and error-corrected data may be written back to the same location on the memory array. Thereafter, a re-reading operation is performed on the written-back data (S44), and an error re-detection operation is performed on a result of the re-reading operation (S45) to determine whether a hard fail exists.

Figure 16:
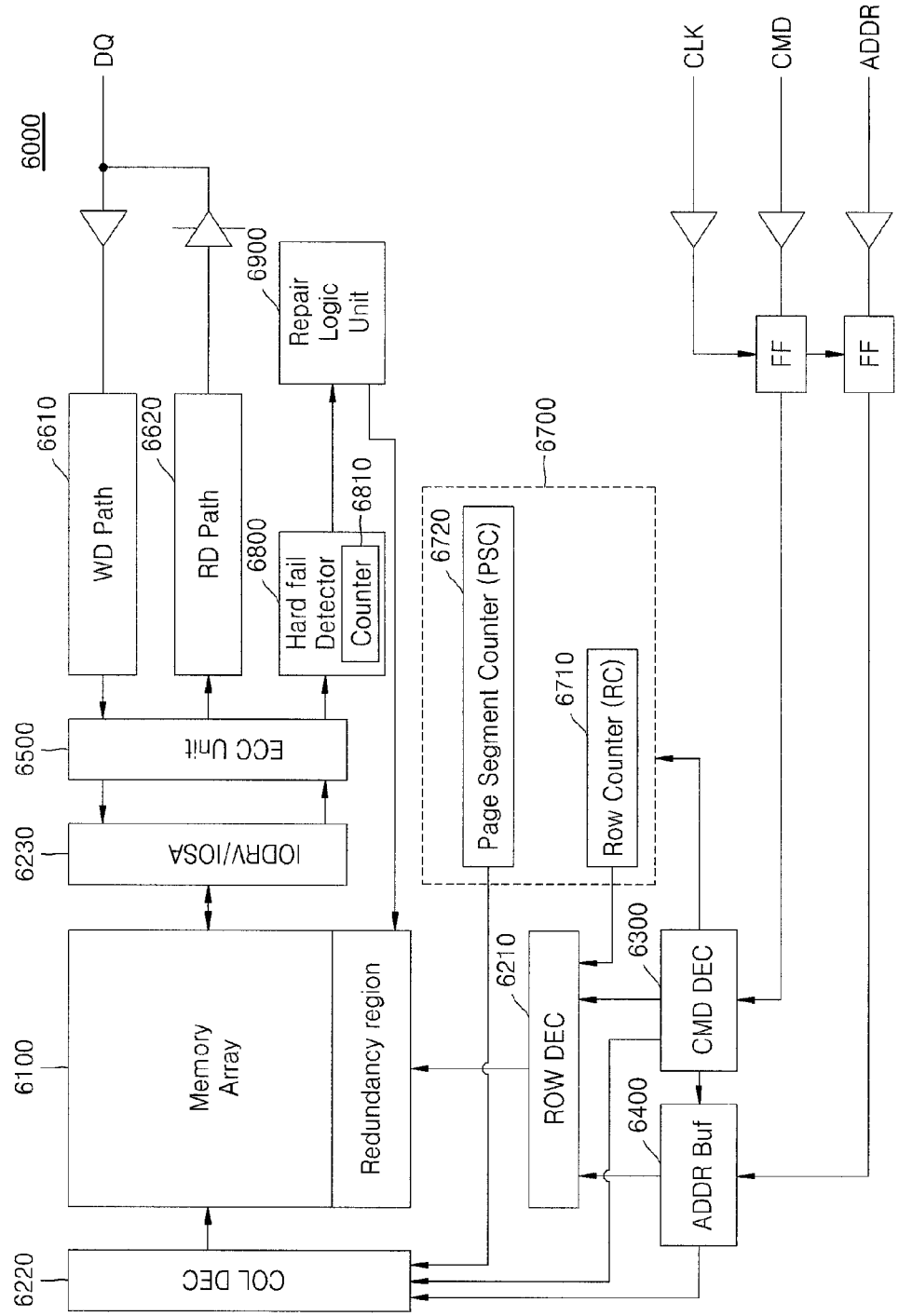
FIGS. 16 and 17 are each a block diagram of a respective memory device performing the steps of FIG. 15, according to example embodiments of the present invention.

FIG. 16 is a block diagram of a DRAM chip 6000 performing the steps of FIG. 15, according to an example embodiment of the present invention. The DRAM chip 6000 includes a memory array 6100 of DRAM cells, a row decoder 6210, a column decoder 6220, a drive/sense amplifier 6230, a command decoder 6300, an address buffer 6400, an ECC (error correction circuit) 6500, and RD (read data) and WD (write data) paths 6610 and 6620, respectively.

For detection of a hard fail and repair operation, the DRAM chip 6000 further includes a scrubbing refresh management unit 6700 for managing a refresh with scrubbing operation, a hard fail detector 6800 for detecting the existence of a hard fail, and a repair logic unit 6900 for repairing the hard fail. The memory array 6100 may further include a redundancy region for replacing a defective region having a hard fail.

The scrubbing refresh management unit 6700 includes at least one counter such as a RC (row counter) 6710 and a PSC (page segment counter) 6720. The hard fail detector 6800 includes an error counter 6810 for counting the number of times an error is generated. Components of the DRAM chip 6000 of FIG. 16 that are the same or similar to those of the previous embodiments operate similarly to those of the previous embodiments such that a detailed descriptions thereof is omitted here.

When a newly defined refresh with scrubbing command or a predefined existing refresh command is received from the external controller, the refresh with scrubbing operation is performed within the DRAM chip 6000. The scrubbing refresh management unit 6700 performs a counting operation in response to such a received command. A page on which refresh is to be performed is selected in the memory array 6100 according to a result of the counting by the RC 6710.

In addition, a sub-page on which scrubbing is to be performed is selected from the selected page according to a result of the counting by the PSC 6720. The data of the selected sub-page is provided to the ECC 6500, and an error detection result is provided to the hard fail detector 6800. When an error is detected, a data re-read operation is performed on the same location on the memory array 6100.

Re-read data is also provided to the ECC 6500, and a result of error detection is provided to the hard fail detector 6800. The hard fail detector 6800 counts the number of times an error is detected from data read from the same location. When the counted number is equal to or greater than a predetermined threshold value, the hard fail detector 6800 determines that a hard fail is generated in the same location on the memory array 6100.

A result of the detection is provided to the repair logic unit 6900 that replaces a defective region of the memory array 6100 having the hard fail with a redundancy region. The replacement may be performed by exchanging an address of the defective region having the hard fail with an address of the redundancy region. The repair logic unit 6900 replaces the defective region having the hard fail with the redundancy region by using such an address exchange.

Figure 17:
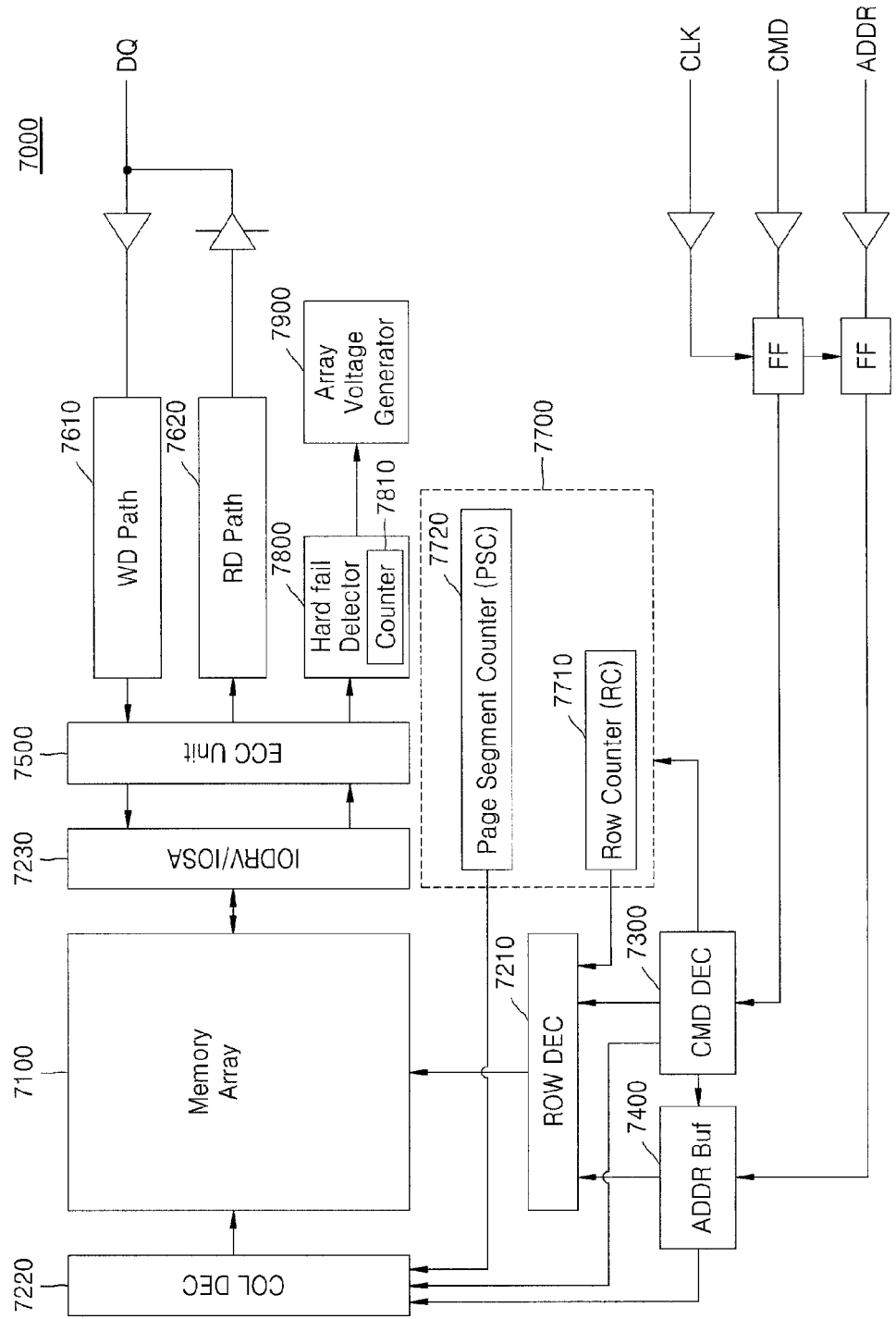

FIG. 17 is a block diagram of a DRAM chip 7000 performing the steps of FIG. 15, according to another example embodiment of the present invention. The DRAM chip 7000 includes a memory array 7100 of DRAM cells, a row decoder 7210, a column decoder 7220, a drive/sense amplifier 7230, a command decoder 7300, an address buffer 7400, an ECC (error correction circuit) 7500, and RD (read data) and WD (write data) paths 7610 and 7620, respectively.

For detection of a hard-fail and repair operation, the DRAM chip 7000 further includes a scrubbing refresh management unit 7700 for managing a refresh with scrubbing operation, a hard fail detector 7800 for detecting a hard fail, and an array voltage generator 7900. The scrubbing refresh management unit 7700 includes at least one counter such as a RC (row counter) 7710 and a PSC (page segment counter) 7720. The hard fail detector 7800 includes an error counter 7810 for counting the number of times an error occurs.

When a newly defined refresh with scrubbing command or a predefined existing refresh command is received from the external controller, the refresh with scrubbing operation is performed within the DRAM chip 7000. Data on which scrubbing is to be performed is read from the memory array 7100 and provided to the ECC 7500. A result of error detection is provided to the hard fail detector 7800, and a data re-read operation with respect to the same location on the memory array 7100 is performed according to the result of the error detection.

A result of error detection with respect to re-read data is provided to the hard fail detector 7800 that in turn provides the array voltage generator 7900 with a result signal representing the result of error detection at the same location. The result signal is a control signal for changing the level of an array voltage that is generated by the array voltage generator 7900 for application on the memory array 7100. In other words, the hard fail detector 7800 monitors a fail rate in the memory array 7100 during the refresh with scrubbing operation to generate a control signal for increasing or decreasing the level of the array voltage according to a result of the monitoring.

Alternatively, a repairing operation for a hard fail in the memory array may be implemented in other various forms. For example, generation or non-generation of a hard fail in the memory array 7100 may be monitored, and correction may be performed so that error occurrence is decreased during a data read operation according to the result of detection of a hard fail. Error occurrence information may be provided to the external controller that reduces the errors such as by adjustment of the refresh cycle for example.

Figure 18:
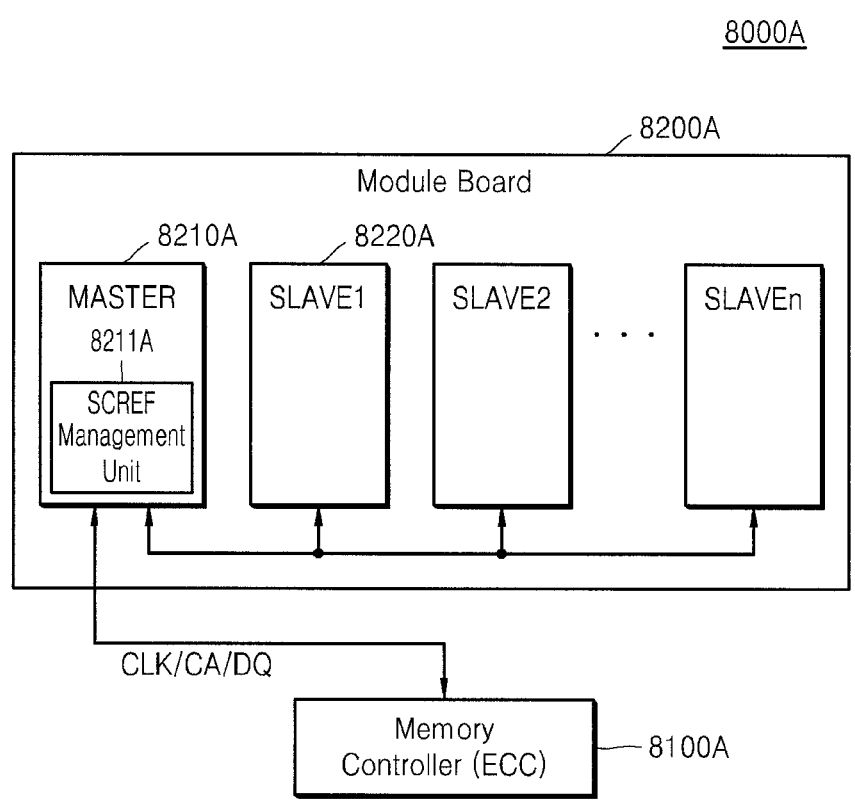
FIG. 18 is a block diagram of a memory system with a master and a slave including a refresh management unit of embodiments of the present invention.

FIG. 18 is a block diagram of a memory system 8000A having refresh with scrubbing according to embodiments of the present invention as described herein. The memory system 8000A includes a memory controller 8100A and a memory module 8200A. The memory module 8200A includes a master chip 8210A and at least one slave chip 8220A that are mounted on a module board. For example in FIG. 18, one master chip 8210A and n slave chips 8220A are mounted on the module board.

The master chip 8210A transmits a control signal CLK such as a clock signal, a command/address signal CA, and data DQ to and receives the same from the memory controller 8100A. The master chip 8210A includes an interface circuit (not shown) for interfacing with the memory controller 8100A. The master chip 8210A transmits a signal from the memory controller 8100A to the slave chips 8220A via an interface circuit and transmits a signal from the slave chips 8220A to the memory controller 8100A.

For performing the refresh with scrubbing operation, the master chip 8210A includes a scrubbing refresh management unit 8211A that operates in response to the a newly defined refresh with scrubbing command or a predefined existing refresh command from the memory controller 8100A. During the refresh with scrubbing operation, data of the master chip 8210A and/or the slave chips 8220A is provided to an ECC (error correction circuit, not shown) of the master chip 8210A for error correction and a write back operation according to a result of error detection. In addition, error statistics of the master chip 8210A and the slave chips 8220A may be monitored during the refresh with scrubbing operation for repairing a hard fail in the master chip 8210A.

Although not illustrated in FIG. 18, the ECC operation for the refresh with scrubbing operation may or may not be separated from the ECC operation for a read/write operation. For example, if such ECC operations are both within the master chip 8210A, the ECC operation for a read/write operation is performed within the master chip 8210A, and a single-bit error of read data is corrected within the master chip 8210A. On the other hand if such ECC operations are separated from each other, the ECC operation for a refresh with scrubbing operation is performed within the master chip 8210A, and the ECC operation for a read/write operation is performed within the controller 8100A.

Figure 19:
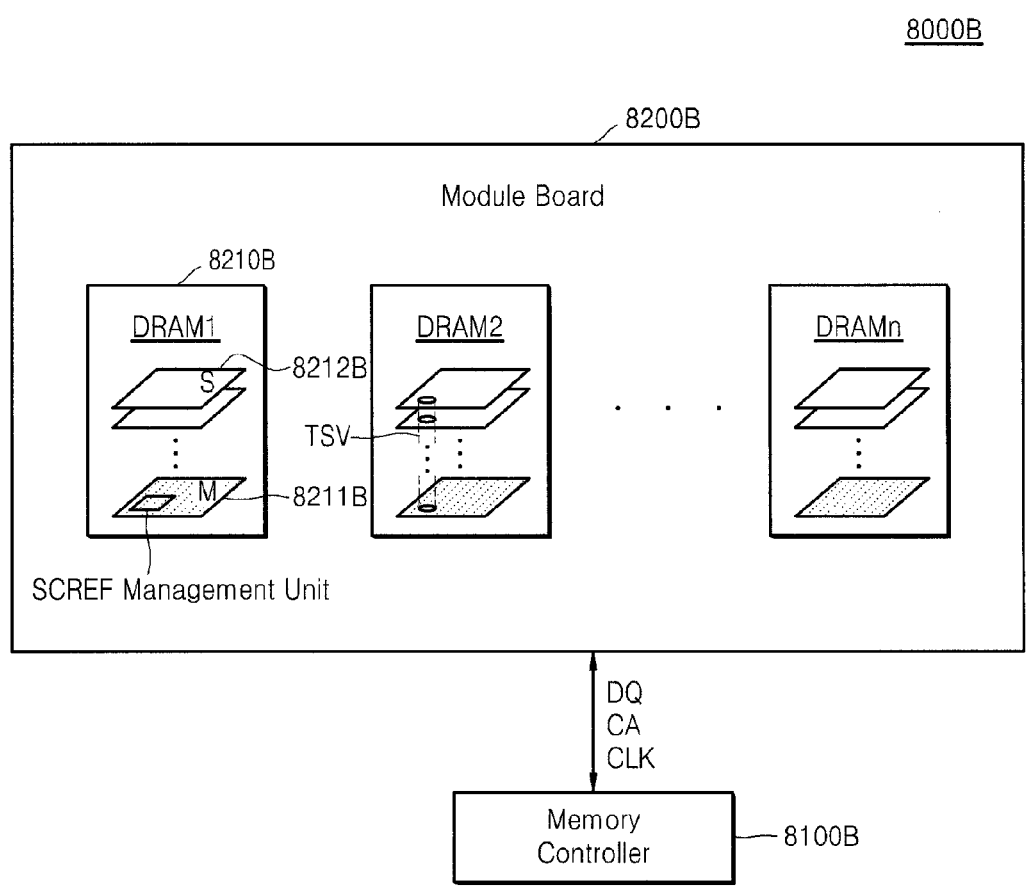
FIG. 19 is a block diagram of a memory system with stacked memory chips including a refresh management unit of embodiments of the present invention.

FIG. 19 is a block diagram of a memory system 8000B having refresh with scrubbing according to embodiments of the present invention as described herein. The memory system 8000B includes a memory controller 8100B and a memory module 8200B. The memory module 8200B includes a plurality of semiconductor memory devices 8210B mounted on a module board, and each semiconductor memory device 8210B has a plurality of stacked DRAM chips. Each DRAM chip 8210B includes at least one master chip 8211B and at least one slave chip 8212B that transmit and receive at least one signal with each other via a through-silicon via (TSV).

The master chip 8211B transmits a control signal CLK such as a clock signal, a command/address signal CA, and data DQ to and receives the same from the memory controller 8100B. The master chip 8211B also transmits an external signal to the slave chips 8212B via the TSV or provides a signal from the slave chips 8212B to the memory controller 8100B.

For performing the refresh with scrubbing operation, the master chip 8211B includes a scrubbing refresh management unit which operates in response to a newly defined refresh with scrubbing command or a predefined existing refresh command from the memory controller 8100B. During a refresh with scrubbing operation, data and/or parities in a corresponding semiconductor memory device 8210B are provided to the master chip 8211B, and an error correction and a write back operation are performed on the data according to a result of error detection. As described in the aforementioned embodiments, error statistics of the master chip 8211B and the slave chips 8212B may be monitored during the refresh with scrubbing operation for performing a repair of a hard fail in the master chip 8211B.

Figure 20:
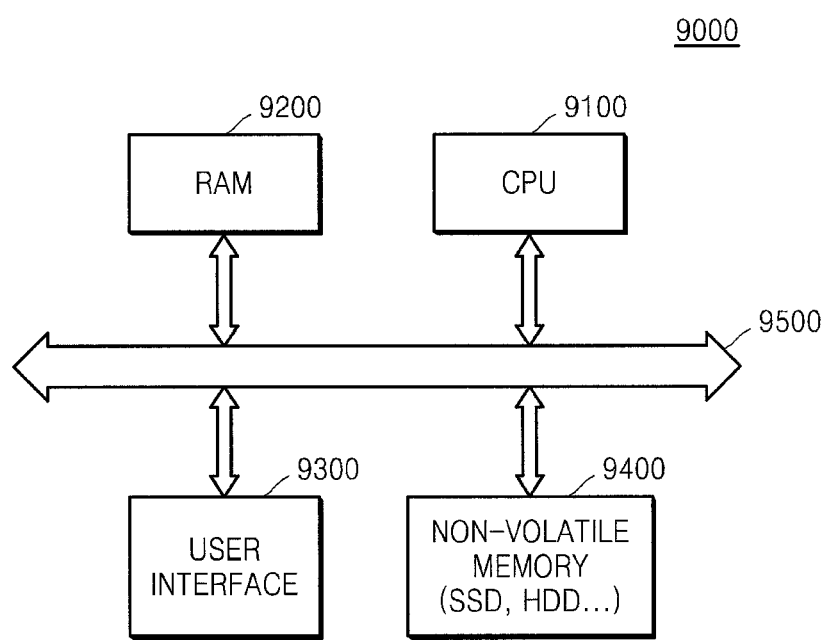
FIG. 20 is a block diagram of a computing system with a memory system including a refresh management unit of embodiments of the present invention.

FIG. 20 is a block diagram of a computing system 9000 on which a memory system is mounted with the memory system having refresh with scrubbing according to embodiments of the present invention as described herein. A RAM (random access memory) 9200 is mounted in an information processing system such as a mobile device or a desk top computer. The RAM 9200 may have refresh with scrubbing according to embodiments of the present invention as described herein as a semiconductor memory device or in a memory module. The RAM 9200 may include a memory device and a memory controller.

The computing system 9000 includes a CPU 9100, the RAM 9200, a user interface 9300, and a non-volatile memory 9400 that are each electrically connected to a bus 9500. The non-volatile memory 9400 may be a large-capacity storage device such as an SSD (solid state drive) or a HDD (hard disk drive).

In the computing system 9000, the RAM 9200 includes a plurality of DRAM chips (not shown) having DRAM cells for storing data. Each DRAM chip is configured to perform the refresh with scrubbing operation according to embodiments of the present invention as described herein. For example, each DRAM chip included in the RAM 9200 is configured for sequentially performing data read, error detection/correction, and a data write back operation in response to a command from a controller. Accordingly, errors may be prevented from accumulating in data stored in a DRAM chip such that reliable data may be read from the DRAM chip for use in the computing system 9000.

Figure 21:
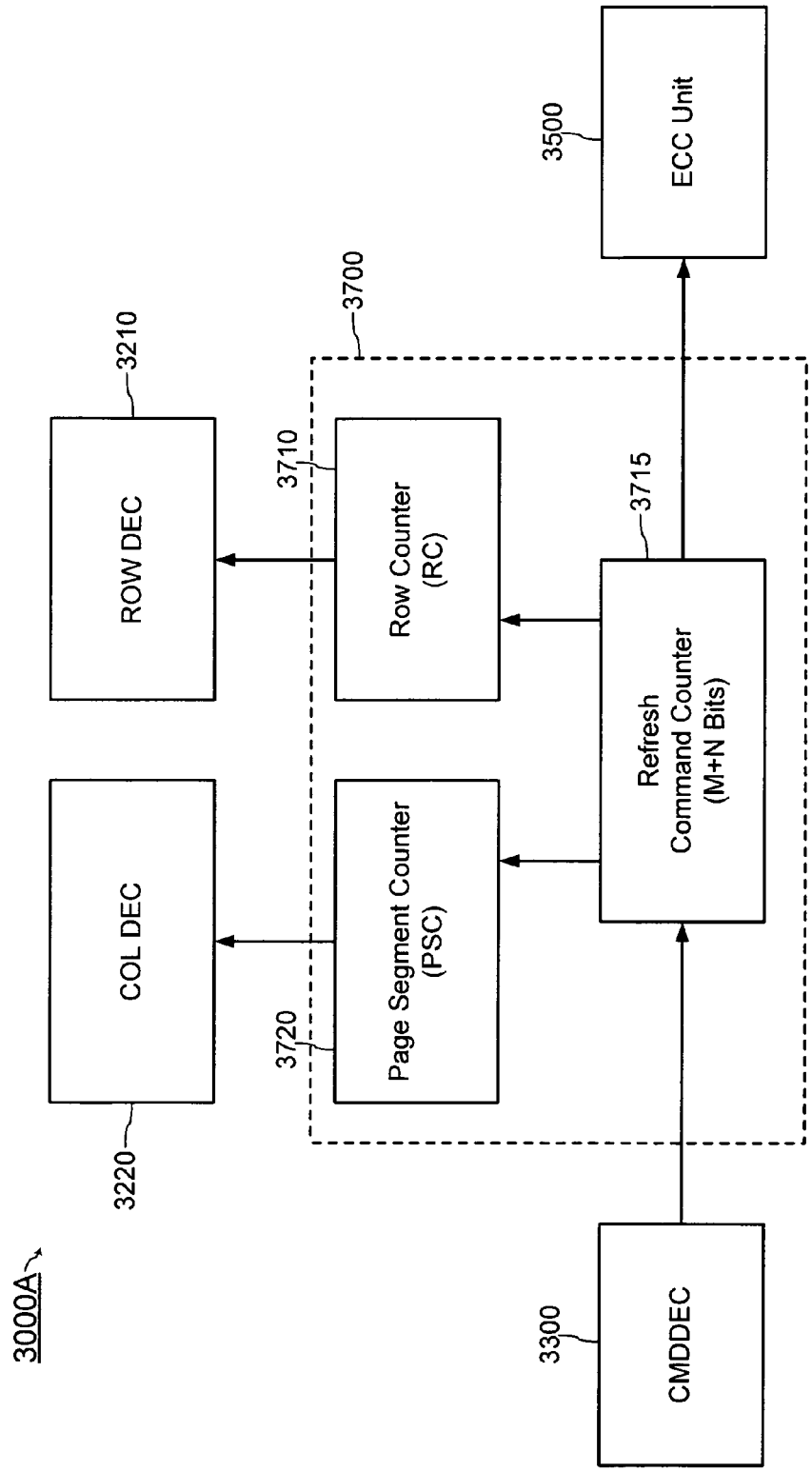
FIG. 21 is a block diagram of a memory device having a refresh management unit for controlling a refresh with scrubbing operation and a refresh without scrubbing operation, according to an example embodiment of the present invention.

FIG. 21 is a block diagram of a semiconductor memory device 3000A having a refresh management unit 3700 for controlling a refresh with scrubbing operation and a refresh without scrubbing operation, according to an example embodiment of the present invention. Similar to the semiconductor memory device 3000 of FIG. 6, the semiconductor memory device 3000A of FIG. 21 includes the refresh management unit 3700, the command decoder (CMDDEC) 3300, the column decoder (COL DEC) 3220, the row decoder (ROW DEC) 3210, and the error correction circuit (ECC) unit 3500.

Also similar to the semiconductor memory device 3000 of FIG. 6, the refresh management unit 3700 of FIG. 21 includes at least one counter such as the row counter (RC) 3710 (i.e., a page counter) and the page segment counter (PSC) 3720. However, the refresh management unit 3700 of FIG. 21 further includes an M+N bits refresh command counter 3715.

Figure 22:
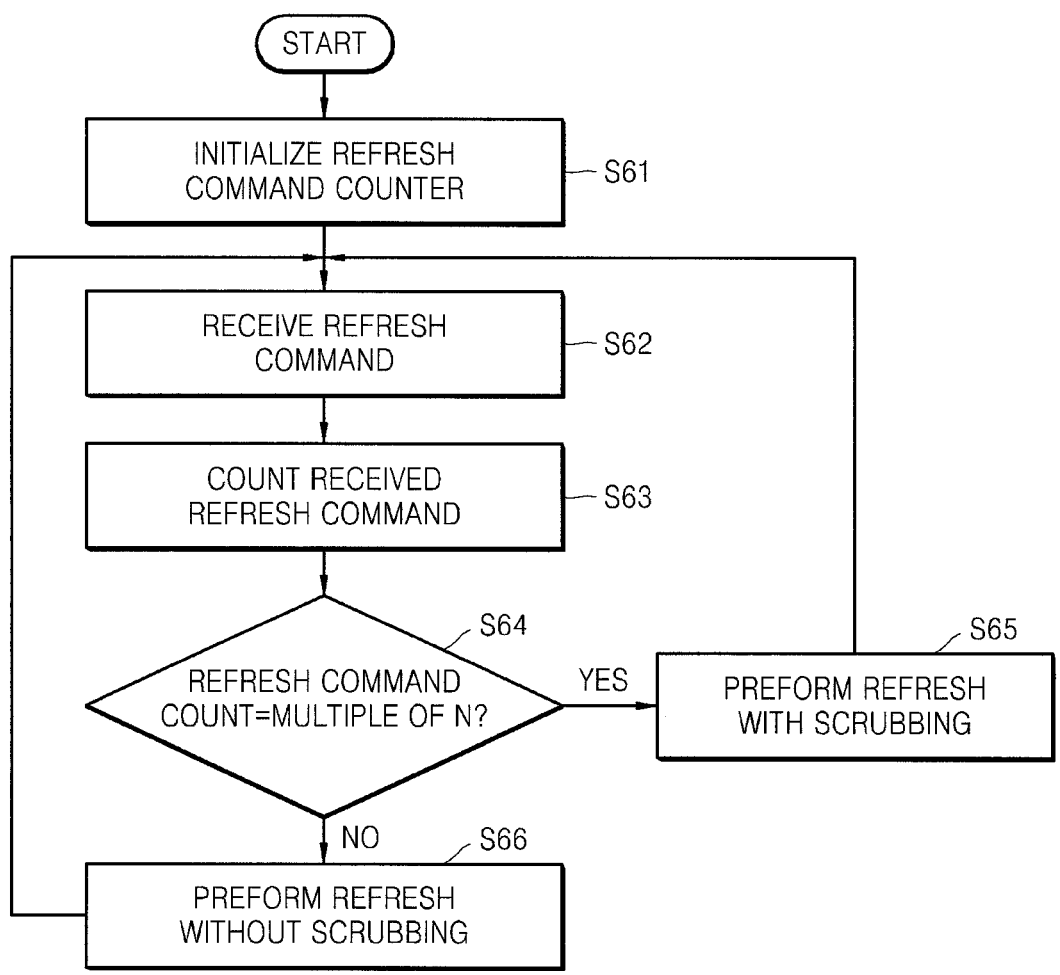
FIG. 22 is a flowchart of steps during operation of the memory device of FIG. 21, according to an example embodiment of the present invention.
Figure 23:
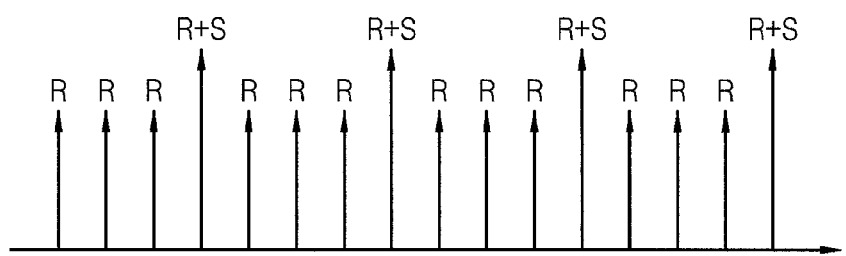
FIG. 23 illustrates multiple refresh with scrubbing operations and refresh without scrubbing operations, according to an example embodiment of the present invention.

FIG. 22 is a flowchart of steps during operation of the semiconductor memory device 3000A of FIG. 21, according to an example embodiment of the present invention. In addition, FIG. 23 illustrates multiple refresh with scrubbing operations and refresh without scrubbing operations performed by the semiconductor memory device 3000A of FIG. 21, according to an example embodiment of the present invention.

Referring to FIGS. 21 and 22, the counters 3710, 3715, and 3720 of the refresh management unit 3700 are initialized (step S61) such as at power-up of the semiconductor memory device 3000A for example. The command decoder 3300 receives a refresh command such as from an external memory controller (step S62). The refresh command may be a newly defined refresh with scrubbing command (i.e., a specialized refresh and scrub command) or a predefined existing refresh command (such as an auto refresh command or a self refresh command) from the controller.

The refresh command counter 3715 is controlled by the command decoder 300 to increment a refresh command count each time the command decoder 3300 receives such a refresh command (step S63). In an example embodiment of the present invention, the refresh command counter 3715 is an M+N bits counter.

When the refresh command counter 3715 first counts with increments to the least significant N-bits (step S64: NO), the refresh command counter 3715S controls the row counter 3710 such that a refresh without scrubbing operation is performed (S66). For example, the row counter 3710 is controlled to generate a row address such that a corresponding page (i.e. row) of memory cells in the memory array is activated to be refreshed without any data scrubbing within that row. Alternatively, the row counter 3710 is controlled to sequentially generate a plurality of row addresses such that corresponding pages (i.e., rows) of the memory array are activated to be refreshed without any data scrubbing within such pages.

After the refresh command counter 3715 increments through the least significant N-bits to increment the most significant M-bits (step S64: YES), the refresh command counter 3715S controls the row counter 3710 and the page segment counter 3720 such that a refresh with scrubbing operation is performed (S65). For example, the row counter 3710 is controlled to generate a row address such that a corresponding page (i.e., row) of the memory array is activated to be refreshed.

In addition, the page segment counter 3720 is controlled to generate at least one page segment address such that at least one corresponding page segment within that page has data scrubbing performed thereon. Such data scrubbing includes reading data from such a page segment, error detection/correction, and write back of error-corrected data for such a page segment.

Alternatively in step S65, the row counter 3710 is controlled to sequentially generate a plurality of row addresses such that corresponding pages (i.e., rows) of the memory array are activated to be refreshed. In addition in that case, the page segment counter 3720 is controlled to generate at least one page segment address such that at least one corresponding page segment within each of such rows has data scrubbing performed thereon.

In this manner referring to FIG. 23, each of a plurality of refresh with scrubbing operations (R+S) are performed between multiple refresh without scrubbing (R) operations. For example in FIG. 23, each refresh with scrubbing operation (R+S) is performed at each fourth refresh command counted by the refresh command counter 3715. Thus, a page of memory array has refresh performed thereon with a first frequency, and has scrubbing performed thereon with a second frequency that is less than the first frequency. For example, the first frequency of refreshing the page is four times the second frequency of data scrubbing the page as illustrated in FIG. 23.

Further in FIG. 23, refresh with scrubbing (R+S) alternates in time with three refreshes without scrubbing (R). Thus, a first number of refresh without scrubbing operations performed on the memory array is higher than a second number of the refresh with scrubbing operations performed on the memory array.

In an alternative embodiment of the present invention, each refresh without scrubbing (R) operation in FIG. 23 is performed in response to a predefined existing refresh command such as an auto refresh command or a self refresh command (a first type refresh command) generated from the memory controller. Also in that case in FIG. 23, each refresh with scrubbing (R+S) operation is performed in response to a newly defined specialized refresh and scrub command (i.e., a second type refresh command) generated from the memory controller.

In a further embodiment of the present invention, when the newly defined specialized refresh and scrub command is generated, refresh with scrubbing is sequentially performed to each of at least two sub-pages such as illustrated in FIG. 9B for example. Thereafter, the page having such sub-pages is deactivated by being pre-charged after such refresh with scrubbing of the at least two sub-pages.

In another embodiment of the present invention, a period of the refresh and scrub command (R+S) being generated is $2^n$ times of a period of the refresh without scrubbing command (R) being generated between the refresh and scrub commands, with n being a natural number such as 2 in the example of FIG. 23.

In an alternative embodiment of the present invention, each refresh without scrubbing (R in FIG. 23) is performed in response to a self refresh command. Also in that case, each refresh with scrubbing (R+S in FIG. 23) is performed from a count of internal refresh commands generated in response to the self refresh command. In this case, the refresh command counter 3715 receives and counts such internal refresh commands generated in response to the self refresh command.

In this manner, a first total number of the refresh without scrubbing (R) performed on the memory device is greater than a second total number of the refresh with scrubbing (R+S) performed on the memory device. Data scrubbing increase power consumption of the memory device and does not need to be performed as frequently as refreshing of the memory device. Thus by performing data scrubbing less frequently than data refreshing, undue power consumption is minimized while data error accumulation is also minimized.

While the present invention has been particularly shown and described with reference to exemplary embodiments thereof, it will be understood that various changes in form and details may be made therein without departing from the spirit and scope of the following claims.

What is claimed is:

1. A method of refreshing a memory device, comprising:
   counting each time a refresh command is received by a command decoder to generate a refresh command count by a refresh command counter;
   performing at least one refresh without scrubbing on a corresponding portion of the memory device when said refresh command count increments first at least one bit of said refresh command count; and
   performing at least one refresh with scrubbing on a corresponding portion of the memory device when said refresh command count increments second at least one bit of said refresh command count.

2. The method of claim 1, wherein a portion of the memory device has the refresh without scrubbing performed thereon with a first frequency and has the refresh with scrubbing performed thereon with a second frequency that is less than said first frequency.

3. The method of claim 1, wherein said refresh without scrubbing alternates in time with said refresh with scrubbing.

4. The method of claim 1, wherein a first number of the at least one refresh without scrubbing is higher than a second number of the at least one refresh with scrubbing.

5. The method of claim 4, wherein each refresh with scrubbing is performed between multiple refreshes without scrubbing.

6. The method of claim 1, wherein each refresh without scrubbing is performed in response to a first type refresh command generated from a memory controller, and wherein each refresh with scrubbing is performed in response to a second type refresh command generated from the memory controller.

7. The method of claim 6, wherein each refresh without scrubbing is performed in response to an auto or self refresh command generated from the memory controller.

8. The method of claim 7, wherein each refresh with scrubbing is performed in response to a specialized refresh and scrub command generated from the memory controller.

9. The method of claim 8, wherein when the specialized refresh and scrub command is generated, the method includes the step of:
   performing sequentially a respective refresh with scrubbing to each of at least two sub-pages of the memory device.

10. The method of claim 9, further including:
    pre-charging said at least two sub-pages of the memory device after said refresh with scrubbing of the at least two sub-pages.

11. The method of claim 1, wherein each refresh without scrubbing is performed in response to a first type refresh command generated from a memory controller, and wherein each refresh with scrubbing is performed in response to a refresh and scrub command generated from a refresh command counter.

12. The method of claim 11, wherein a period of the refresh and scrub command being generated is $2^n$ times of a period of the first type refresh command being generated with n being a natural number.

13. The method of claim 1, wherein each refresh without scrubbing is performed in response to a self refresh command, and wherein each refresh with scrubbing is performed from a count of internal refresh commands generated in response to the self refresh command.

14. The method of claim 1, wherein a first total number of the at least one refresh without scrubbing performed on the memory device is greater than a second total number of the at least one refresh with scrubbing performed on the memory device.

15. The method of claim 1, wherein each refresh with or without scrubbing is performed on a respective page of memory cells.

16. The method of claim 1, wherein each refresh without scrubbing is performed on a respective page of memory cells, and wherein each refresh with scrubbing is performed on a respective sub-page of memory cells.

17. A refresh management unit in a memory device, the refresh management unit comprising:
    a refresh command counter for counting each time a refresh command is received by a command decoder to generate a refresh command count;
    a first counter for controlling performance of at least one refresh without scrubbing on a corresponding portion of the memory device when said refresh command counter increments first at least one bit of said refresh command count; and
    a second counter for controlling performance of at least one refresh with scrubbing on a corresponding portion of the memory device when said refresh command counter increments second at least one bit of said refresh command count.

18. The refresh management unit of claim 17, further comprising:
    a page counter that is the first counter for generating a refresh address for having said refresh without scrubbing performed thereon.

19. The refresh management unit of claim 18, further comprising:
    a page segment counter that is the second counter for generating an address of a sub-page for having said refresh with scrubbing performed thereon.

20. The refresh management unit of claim 19, wherein each refresh without scrubbing is performed on a respective page of memory cells, and wherein each refresh with scrubbing is performed on a respective sub-page of memory cells.

21. The refresh management unit of claim 19, wherein said page counter generates the refresh address having the refresh without scrubbing performed thereon with a first frequency, and wherein said page segment counter generates the sub-page address having the refresh with scrubbing performed thereon with a second frequency that is less than said first frequency.

22. The refresh management unit of claim 18, wherein each refresh without scrubbing is performed in response to a self refresh command, and wherein each refresh with scrubbing is performed from the refresh command counter counting internal refresh commands generated in response to the self refresh command.

23. The refresh management unit of claim 17, wherein said at least one refresh without scrubbing alternates in time with said at least one refresh with scrubbing.

24. The refresh management unit of claim 17, wherein a first number of the at least one refresh without scrubbing is higher than a second number of the at least one refresh with scrubbing.

25. The refresh management unit of claim 24, wherein each refresh with scrubbing is performed between multiple refreshes without scrubbing.

26. The refresh management unit of claim 17, wherein each refresh without scrubbing is performed in response to a first type refresh command generated from a memory controller, and wherein each refresh with scrubbing is performed in response to a second type refresh command generated from the memory controller.

27. The refresh management unit of claim 17, wherein each refresh without scrubbing is performed in response to an auto or self refresh command generated from the memory controller.

28. The refresh management unit of claim 27, wherein each refresh with scrubbing is performed in response to a specialized refresh and scrub command generated from the memory controller.

29. The refresh management unit of claim 28, wherein a respective refresh with scrubbing is sequentially performed to each of at least two sub-pages of the memory device when the specialized refresh and scrub command is generated.

30. The refresh management unit of claim 29, wherein said at least two sub-pages of the memory device is pre-charged after said refresh with scrubbing of the at least two sub-pages.

31. The refresh management unit of claim 17, wherein each refresh without scrubbing is performed in response to a first type refresh command generated from a memory controller, and wherein each refresh with scrubbing is performed in response to a refresh and scrub command generated from the refresh command counter.

32. The refresh management unit of claim 31, wherein a period of the refresh and scrub command being generated is $2^n$ times of a period of the first type refresh command being generated with n being a natural number.

33. The refresh management unit of claim 17, wherein a first total number of the at least one refresh without scrubbing performed on the memory device is greater than a second total number of the at least one refresh with scrubbing performed on the memory device.

34. The refresh management unit of claim 17, wherein each refresh with or without scrubbing is performed on a respective page of memory cells.

35. A memory device comprising:
a cell array; and
a refresh management unit including:
a refresh command counter for counting each time a refresh command is received by a command decoder to generate a refresh command count;
a first counter for controlling performance of at least one refresh without scrubbing on a corresponding portion of the cell array when said refresh command counter increments first at least one bit of said refresh command count; and
a second counter for controlling performance of at least one refresh with scrubbing on a corresponding portion of the cell array when said refresh command counter increments second at least one bit of said refresh command count.

36. The memory device of claim 35, wherein the refresh management unit further includes:
a page counter that is the first counter for generating a refresh address for having said refresh without scrubbing performed thereon.

37. The memory device of claim 36, wherein the refresh management unit further includes:
a page segment counter that is the second counter for generating an address of a sub-page for having said refresh with scrubbing performed thereon.

38. The memory device of claim 37, wherein each refresh without scrubbing is performed on a respective page of memory cells, and wherein each refresh with scrubbing is performed on a respective sub-page of memory cells.

39. The memory device of claim 37, wherein said page counter generates the refresh address having the refresh without scrubbing performed thereon with a first frequency, and wherein said page segment counter generates the sub-page address having the refresh with scrubbing performed thereon with a second frequency that is less than said first frequency.

40. The memory device of claim 36, wherein each refresh without scrubbing is performed in response to a self refresh command, and wherein each refresh with scrubbing is performed from the refresh command counter counting internal refresh commands generated in response to the self refresh command.

41. The memory device of claim 35, wherein said at least one refresh without scrubbing alternates in time with said at least one refresh with scrubbing.

42. The memory device of claim 35, wherein a first number of the at least one refresh without scrubbing is higher than a second number of the at least one refresh with scrubbing.

43. The memory device of claim 42, wherein each refresh with scrubbing is performed between multiple refreshes without scrubbing.

44. The memory device of claim 35, wherein each refresh without scrubbing is performed in response to a first type refresh command generated from a memory controller, and wherein each refresh with scrubbing is performed in response to a second type refresh command generated from the memory controller.

45. The memory device of claim 35, wherein each refresh without scrubbing is performed in response to an auto or self refresh command generated from the memory controller.

46. The memory device of claim 45, wherein each refresh with scrubbing is performed in response to a specialized refresh and scrub command generated from the memory controller.

47. The memory device of claim 46, wherein a respective refresh with scrubbing is sequentially performed to each of at least two sub-pages of the memory device when the specialized refresh and scrub command is generated.

48. The memory device of claim 47, wherein said at least two sub-pages of the memory device is pre-charged after said refresh with scrubbing of the at least two sub-pages.

49. The memory device of claim 35, wherein each refresh without scrubbing is performed in response to a first type refresh command generated from a memory controller, and wherein each refresh with scrubbing is performed in response to a refresh and scrub command generated from a refresh command counter.

50. The memory device of claim 49, wherein a period of the refresh and scrub command being generated is $2^n$ times of a period of the first type refresh command being generated with n being a natural number.

51. The memory device of claim 35, wherein a first total number of the at least one refresh without scrubbing performed on the memory device is greater than a second total number of the at least one refresh with scrubbing performed on the memory device.

52. The memory device of claim 35, wherein each refresh with or without scrubbing is performed on a respective page of memory cells.

* * * * *